(12) United States Patent
Kim et al.

(10) Patent No.: US 12,035,616 B2
(45) Date of Patent: Jul. 9, 2024

(54) ORGANIC ELECTROLUMINESCENCE DEVICE AND ORGANOMETALLIC COMPLEX FOR ORGANIC ELECTROLUMINESCENCE DEVICE

(71) Applicant: Samsung Display Co., Ltd., Yongin-si (KR)

(72) Inventors: Haejin Kim, Hwaseong-si (KR); Soo-Byung Ko, Yongin-si (KR); Sungbum Kim, Yongin-si (KR); Sujin Shin, Daegu (KR); Eunsoo Ahn, Jinju-si (KR); Eunyoung Lee, Sejong-si (KR); Jaesung Lee, Hwaseong-si (KR); Hyunjung Lee, Pohang-si (KR); Mina Jeon, Hwaseong-si (KR); Junghoon Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 727 days.

(21) Appl. No.: 16/890,520

(22) Filed: Jun. 2, 2020

(65) Prior Publication Data

US 2021/0036243 A1 Feb. 4, 2021

(30) Foreign Application Priority Data

Aug. 2, 2019 (KR) ........................ 10-2019-0094565

(51) Int. Cl.
| | |
|---|---|
| C09K 11/06 | (2006.01) |
| C07F 15/00 | (2006.01) |
| H10K 85/30 | (2023.01) |
| H10K 50/11 | (2023.01) |
| H10K 50/15 | (2023.01) |
| H10K 50/16 | (2023.01) |

(52) U.S. Cl.
CPC ....... *H10K 85/346* (2023.02); *C07F 15/0086* (2013.01); *C09K 11/06* (2013.01); *C09K 2211/1029* (2013.01); *C09K 2211/1044* (2013.01); *C09K 2211/185* (2013.01); *H10K 50/11* (2023.02); *H10K 50/15* (2023.02); *H10K 50/16* (2023.02)

(58) Field of Classification Search
CPC ............................ C09K 11/06; C07F 15/0086
See application file for complete search history.

(56) References Cited

U.S. PATENT DOCUMENTS

| 8,216,698 B2 | 7/2012 | Murakami et al. |
|---|---|---|
| 9,318,725 B2 | 4/2016 | Li |
| 9,385,329 B2 | 7/2016 | Li et al. |
| 9,461,254 B2 | 10/2016 | Tsai et al. |
| 9,923,155 B2 | 3/2018 | Li et al. |
| 9,947,881 B2 | 4/2018 | Li et al. |
| 10,211,414 B2 | 2/2019 | Li et al. |
| 10,381,580 B2 | 8/2019 | Xia et al. |
| 2013/0048963 A1 | 2/2013 | Beers et al. |
| 2013/0168656 A1 | 7/2013 | Tsai et al. |
| 2014/0364605 A1 | 12/2014 | Li et al. |
| 2018/0244706 A1 | 8/2018 | Lee et al. |
| 2018/0301641 A1 | 10/2018 | Li et al. |
| 2018/0309072 A1 | 10/2018 | Lee et al. |
| 2018/0331305 A1 | 11/2018 | Kim et al. |
| 2018/0362567 A1 | 12/2018 | Hwang et al. |
| 2019/0036042 A1 | 1/2019 | Kim et al. |
| 2019/0225636 A1 | 7/2019 | Bae et al. |

FOREIGN PATENT DOCUMENTS

| CN | 103102372 A | 5/2013 |
|---|---|---|
| CN | 103476781 A | 12/2013 |
| CN | 104272487 A | 1/2015 |
| CN | 104693243 A | 6/2015 |
| CN | 109810106 A | 5/2019 |
| CN | 110066296 A | 7/2019 |
| EP | 3 392 258 A1 | 10/2018 |
| JP | 2009-267244 A | 11/2009 |
| JP | 2015-81257 A | 4/2015 |
| KR | 10-2014-0144152 A | 12/2014 |
| KR | 10-2015-0043225 A | 4/2015 |
| KR | 10-2016-0012941 A | 2/2016 |
| KR | 10-2018-0118484 A | 10/2018 |
| KR | 10-2018-0137311 A | 12/2018 |
| KR | 10-1927580 B1 | 12/2018 |
| WO | WO 2013/130483 A1 | 9/2013 |

OTHER PUBLICATIONS

Office action for Chinese Patent Application No. 202010756575.1, dated Dec. 20, 2023, 6 pages.

*Primary Examiner* — Shawquia Jackson
(74) *Attorney, Agent, or Firm* — Lewis Roca Rothgerber Christie LLP

(57) ABSTRACT

Provided is an organic electroluminescence device. The organic electroluminescence device according to an embodiment includes a first electrode, a second electrode facing the first electrode, and a plurality of organic layers between the first electrode and the second electrode, wherein at least one of the plurality of organic layers includes an organometallic complex including a metal atom which is a central atom, a plurality of ligand connected to the metal atom, and a nitrogen atom connecting two of the plurality of ligands. The nitrogen atom includes an aromatic ring group as a substituent. The aromatic ring group is not bonded to any of the plurality of ligands to form a ring, thereby allowing the organic electroluminescent device to exhibit a low drive voltage and improved life time.

7 Claims, 2 Drawing Sheets

ORGANIC ELECTROLUMINESCENCE DEVICE AND ORGANOMETALLIC COMPLEX FOR ORGANIC ELECTROLUMINESCENCE DEVICE

CROSS-REFERENCE TO RELATED APPLICATION

This application claims priority to and the benefit of Korean Patent Application No. 10-2019-0094565, filed on Aug. 2, 2019, the entire contents of which are incorporated herein by reference.

BACKGROUND

1. Field

The present disclosure herein relates to an organic electroluminescence device and an organometallic complex for the organic electroluminescence device.

2. Description of the Related Art

Recently, organic electroluminescence displays as an image display device have been under active development. Organic electroluminescence displays are a so-called self-luminous type display which produce excitons by recombining holes and electrons injected from a first electrode and a second electrode in an light emitting layer and achieve display by allowing the produced excitons to fall (e.g., transition) to a ground state to emit light.

To employ the organic electroluminescence device in display devices, development of an organometallic complex is being conducted to use as a dopant material in the development of materials for the light emitting layer. In particular, development of an organometallic complex with improved or optimized light wavelength and a longer life time is desirable as well as an organometallic complex for use in the organic electroluminescence device.

SUMMARY

The present disclosure provides an organic electroluminescence device with an improved life time.

The present disclosure also provides an organometallic complex with an improved life time.

An embodiment of the present disclosure provides an organic electroluminescence device including: a first electrode; a second electrode facing the first electrode; a plurality of organic layers between the first electrode and the second electrode. At least one of the plurality of organic layers includes an organometallic complex including a metal atom which is a central atom; a plurality of ligands connected to the metal atom; and a nitrogen atom connecting two of the plurality of ligands. The nitrogen includes an aromatic ring group as a substituent; and the aromatic ring group is not bonded to any of the plurality of ligands to form a ring.

In an embodiment, the aromatic ring group may be a substituted or unsubstituted C6-30 aryl group or substituted or unsubstituted C2-30 heteroaryl group.

In an embodiment, the metal atom may be Pt, Pd, Cu, Ag, Au, Rh, Ir, Ru, or Os.

In an embodiment, one of the plurality of ligands may be a substituted or unsubstituted 5 membered heterocyclic group or a substituted or unsubstituted ring-forming C2-30 heteroaryl group.

In an embodiment, the plurality of organic layers may include a hole transport region, a light emitting layer, and an electron transport region, and the organometallic complex may be included in the light emitting layer.

In an embodiment, the organometallic complex may be represented by formula 1 below.

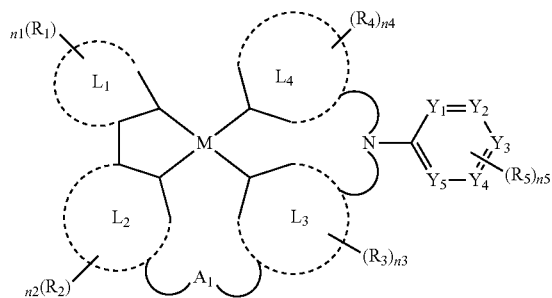

Formula 1

In formula 1 above, M may be Pt, Pd, Cu, Ag, Au, Rh, Ir, Ru, or Os. $L_1$ may be a substituted or unsubstituted 5 membered heterocyclic group or a substituted or unsubstituted ring-forming C2-30 heteroaryl group. $L_2$, $L_3$, and, $L_4$ may each independently be a substituted or unsubstituted ring-forming C6-30 aryl group, or a substituted or unsubstituted ring-forming C2-30 heteroaryl group. $R_1$, $R_2$, $R_3$, and $R_4$ may each independently be a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group, and at least some of $R_1$, $R_2$, $R_3$, or $R_4$ may bind to an adjacent group to form a ring.

$R_5$ may be a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group, and in case of a plurality of $R_5$'s may bind to each other to form a ring. $n_1$ to $n_4$ may each independently be an integer from 0 to 3. $n_5$ may be an integer from 0 to 5. $Y_1$, $Y_2$, $Y_3$, $Y_4$ and $Y_5$ may each independently be C, N, O, or S, $A_1$ may be *—O—*, *—S—*, *—S(=O)—*, *—SO$_2$—*, *—Se—*, *—NR$_{11}$*, *—R$_{11}$P=O—*, *—CR$_{12}$R$_{13}$—*, *—C(=O)—*, *—SiR$_{12}$R$_{13}$, —*, *—GeR$_{12}$R$_{13}$, —*, *—BH—*, *—P(O)H—*, *—PH—*, *—NH*, *—CR$_{12}$H—*, *—CH$_2$—*, *—SiH$_2$—*, *—SiHR$_{12}$—*, *—BR$_{14}$—*, or *—PR$_{14}$—*. $R_{11}$, $R_{12}$, $R_{13}$, and, $R_{14}$ may each independently be a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group, and may bind to adjacent group to form a ring.

In an embodiment, the organometallic complex represented by formula 1 above may be represented by formula 1-1 below.

Formula 1-1

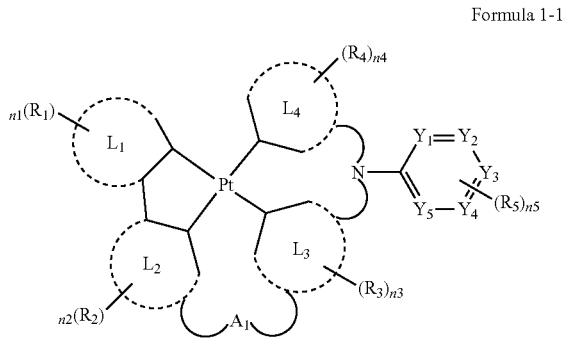

In formula 1-1 above, $L_1$ to $L_4$, $R_1$ to $R_5$, $n_1$ to $n_5$, $A_1$, $R_{11}$ to $R_{14}$ and $Y_1$ to $Y_5$ may be the same as defined by formula 1 above.

In an embodiment, the organometallic complex represented by formula 1 above may be represented by formula 1-2 below.

Formula 1-2

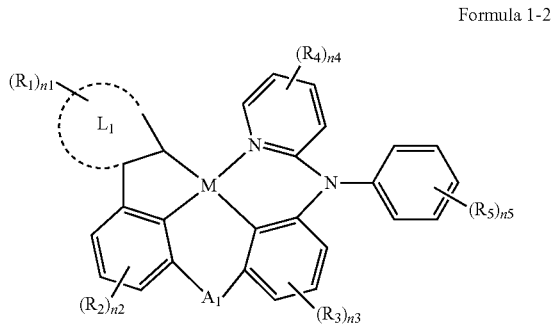

In formula 1-2 above, M, $L_1$, $R_1$ to $R_5$, $n_1$ to $n_5$, $A_1$, and $R_{11}$ to $R_{14}$ may be the same as defined by formula 1 above.

In an embodiment, the organometallic complex represented by formula 1 above may be represented by formula 1-3 below.

Formula 1-3

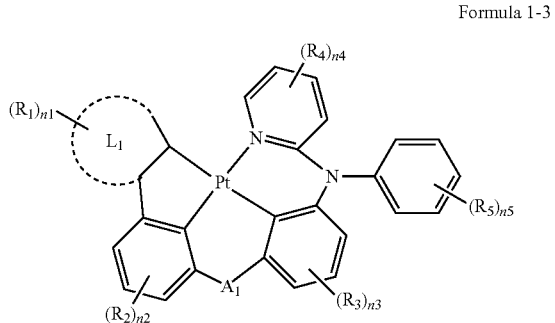

In formula 1-3 above, $L_1$, $R_1$ to $R_5$, $n_1$ to $n_5$, $A_1$, and $R_{11}$ to $R_{14}$ may be the same as defined by formula 1 above.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
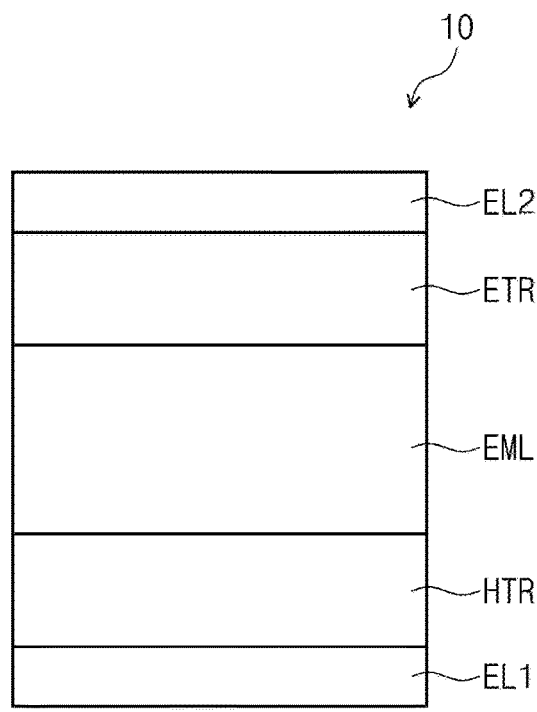
FIG. 1 is a cross-sectional view schematically showing an organic electroluminescence device according to an embodiment of the present disclosure.

The subject matter of the present disclosure may have various modifications and may be embodied in different forms, and exemplary embodiments will be explained in detail with reference to the accompanying drawings. The present disclosure, however, should not be construed as limited to the embodiments set forth herein. Rather, it should be understood that all modifications, equivalents, and alternatives which fall within the spirit and technical scope of the present disclosure are included in the present disclosure.

Like reference numerals refer to like elements throughout. The dimensions of the structures in the accompanying drawings may be enlarged for clarity. Terms such as first, second, etc. may be used herein to describe various elements, but the above elements shall not be limited by the above terms. These terms are only used to distinguish one element from another element. For example, without departing from the scope of the present disclosure, the first component may be referred to as a second component and similarly, the second component may be referred to as the first component. The singular forms used herein include the plural forms unless the context clearly indicates otherwise.

Further, terms such as 'include' or 'have' in this specification specify the presence of features, numbers, steps, operations, components, parts or combinations thereof and shall not be construed to preclude the possibility of presence or addition of features, numbers, steps, operations, components, parts or combinations thereof.

When it is described in this specification that a part of a layer, a film, an area (or region), a substrate, and etc. are 'on' or 'on the upper unit' of another part, such description not only includes the case where the part is directly on the other part but also includes the case where another part exists therebetween. Furthermore, when it is described that a part of a layer, a film, an area (or region), a substrate and etc. is 'under' or 'under the lower unit" of another part, such description not only includes the case where a part is directly under the other part but also includes the case where another part exists therebetween. Furthermore, when it is described in this specification that a part is 'on' another part, such description also includes a case where the part is disposed on lower unit of another part. In addition, it will also be understood that when an element or layer is referred to as being "between" two elements or layers, it can be the only element or layer between the two elements or layers, or one or more intervening elements or layers may also be present.

It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Processes, elements, and techniques that are not necessary to those having ordinary skill in the art for a complete understanding of the aspects and features of the present disclosure may not be described.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, and/or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an organic electroluminescence device according to an embodiment of the present disclosure and an organometallic complex according to an embodiment of the present disclosure will be described with reference to the drawings.

FIGS. 1 to 4 are cross-sectional views schematically showing the organic electroluminescence device 10 according to embodiments of the present disclosure. Referring to FIGS. 1 to 4, the organic electroluminescence device 10 may include a first electrode EL1, a hole transport region HTR, an light emitting layer EML, an electron transport region ETR, and a second electrode EL2, which are laminated sequentially.

The first electrode EL1 and the second electrode EL2 are facing each other, and a plurality of organic layers may be between the first electrode EL1 and the second electrode EL2. The plurality of organic layers may include the hole transport region HTR, the light emitting layer EML, and the electron transport region ETR. The organic electroluminescence device 10 according to an embodiment may include, in at least one of the plurality of organic layers, an organometallic complex which will be described hereinafter.

Figure 2:
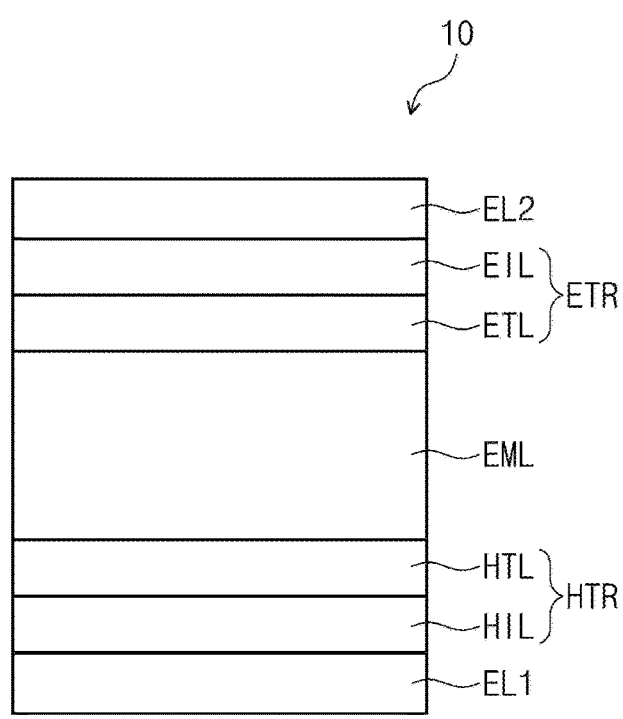
FIG. 2 is a cross-sectional view schematically showing an organic electroluminescence device according to an embodiment of the present disclosure.
Figure 3:
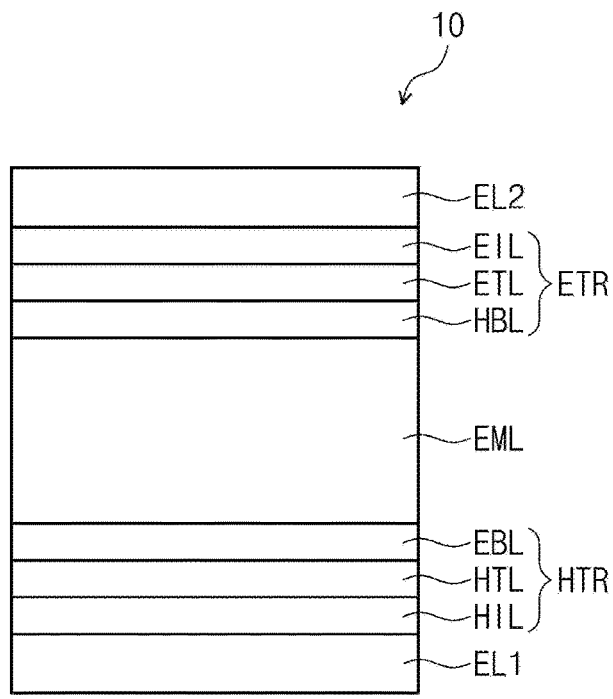
FIG. 3 is a cross-sectional view schematically showing an organic electroluminescence device according to an embodiment of the present disclosure.
Figure 4:
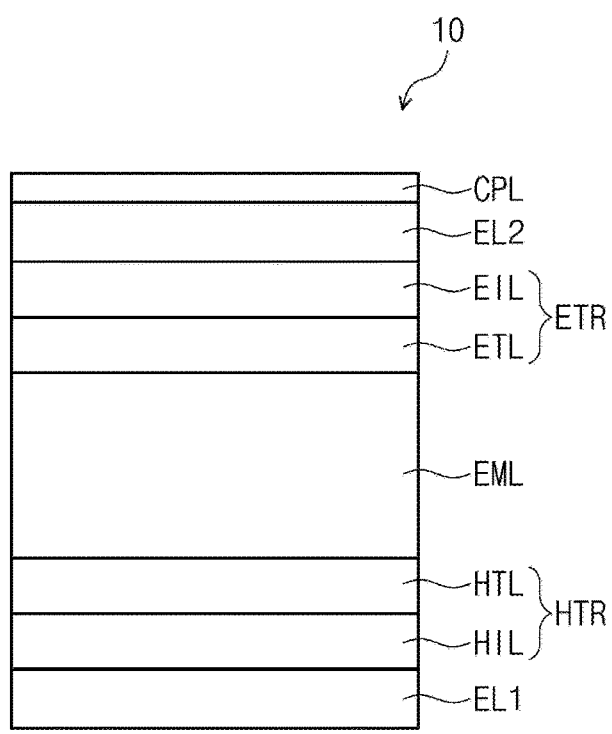
FIG. 4 is a cross-sectional view schematically showing an organic electroluminescence device according to an embodiment of the present disclosure.

When compared with FIG. 1, FIG. 2 shows a cross-sectional view of the organic electroluminescence device 10 according to an embodiment wherein the hole transport region HTR includes a hole injection layer HIL and a hole transport layer HTL, and the electron transport region ETR includes an electron injection layer EIL and an electron transport layer ETL. Also, when compared with FIG. 1, FIG. 3 shows a cross-sectional view of the organic electroluminescence device 10 according to an embodiment wherein the hole transport region HTR includes a hole injection layer HIL, a hole transport layer HTL, and an electron blocking layer (EBL) and the electron transport region ETR includes an electron injection layer EIL, an electron transport layer ETL, and a hole blocking layer HBL. FIG. 4 shows a cross-sectional view of the organic electroluminescence device 10 according to an embodiment wherein a capping layer CPL is included on the second electrode EL2.

The first electrode EL1 has conductivity (e.g., electrical conductivity). The first electrode EL1 may be formed of a metal alloy or a conductive compound. The first electrode EL1 may be an anode. In addition, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), indium tin zinc oxide (ITZO), and/or other suitable material. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). Also, the first electrode EL1 may have a multilayer structure including a reflective film or a transflective film formed of the above-mentioned material and a transparent conductive film formed of indium tin oxide (ITO), indium zinc oxide (IZO), zinc oxide (ZnO), indium tin zinc oxide (ITZO), and/or other suitable material. For example, the first electrode EL1 may have a trilayer structure of ITO/Ag/ITO, but is not limited thereto.

The thickness of the first electrode EL1 may be from about 1000 Å to about 10000 Å. For example, the thickness of the first electrode EL1 may be from about 1000 Å to about 3000 Å.

The hole transport region HTR is provided on the first electrode EL1. The hole transport region HTR may include at least one among the hole injection layer HIL, the hole transport layer HTL, a hole buffer layer, and the electron blocking layer (EBL).

The thickness of the hole transport region HTR may range, for example, from about 1000 Å to about 1500 Å.

The hole transport region HTR may have a single layer structure formed of a single material, a single layer structure formed of a plurality of different materials, or a multilayer formed of a plurality of different materials.

For example, the hole transport region HTR may have a single layer structure of a hole injection layer HIL or a hole transport layer HTL, and may have a single layer structure formed of a hole injection material and a hole transport material.

Also, the hole transport region HTR may have a single layer structure formed of a plurality of different materials or may have a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer (EBL) which are laminated in this order from the first electrode EL1, but the structure of the hole transport region HTR is not limited thereto.

The hole transport region HTR may be formed by using various suitable methods such as a vacuum deposition method, a spin coating method, a cast method, a Langmuir-Blodgett method (LB), an inkjet printing method, a laser printing method, a laser induced thermal imaging (LITI) method, etc.

The hole injection layer HIL may include, for example, a phthalocyanine compound such as copper phthalocyanine and/or other suitable compound; N,N'-diphenyl-N,N'-bis-[4-(phenyl-m-tolyl-amino)-phenyl]-biphenyl-4,4'-diamine (DNTPD), 4,4', 4''-tris(3-methylphenylphenylamino) triphenylamine (m-MTDATA), 4,4'4''-Tris(N,N-diphenylamino) triphenylamine (TDATA), 4,4', 4''-tris{N,-(2-naphthyl)-N-phenylamino}-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid (PANI/CSA), (Polyaniline)/Poly(4-styrenesulfonate) (PANI/PSS), N,N'-di(naphthalene-1-yl)-N,N'-diphenyl-benzidine (NPB), triphenyl amine-containing polyetherketone (TPAPEK), 4-Isopropyl-4'-methyldiphenyliodonium tetrakis(pentafluorophenyl)borate, dipyrazino[2,3-f: 2', 3'-h]quinoxaline-2,3,6,7,10,11-hexacarbonitrile (HAT-CN), and/orother suitable material.

The hole transport layer HTL may include, for example, a carbazole derivative such as N-phenylcarbazole, polyvinyl carbazole, and/or other suitable material, a fluorene derivative, a triphenylamine derivative such as N,N'-bis(3-methylphenyl)-N,N'-diphenyl-[1,1-biphenyl]-4,4'-diamine (TPD), 4,4', 4''-tris(N-carbazolyl)triphenylamine (TCTA), and/or other suitable material, N,N'-di(naphthalene-1-yl)-N, N'-diphenyl-benzidine (NPB), 4,4'-Cyclohexylidene bis[N, N-bis(4-methylphenyl)benzenamine](TAPC), 4,4'-Bis[N, N'-(3-tolyl)amino]-3,3'-dimethylbiphenyl), 1,3-Bis(N-carbazolyl)benzene (mCP), and/or other suitable material.

The thickness of the hole transport region HTR may be from about 100 Å to about 10000 Å. For example, the thickness may be from about 100 Å to about 5000 Å. The thickness of the hole injection layer HIL may range, for example, from about 30 Å to about 1000 Å and the thickness of the hole transport layer HTL may be from about 30 Å to about 1000 Å. For example, the thickness of the electron blocking layer (EBL) may be from about 10 Å to about 1000 Å. When the thicknesses of the hole transport region HTR, the hole injection layer HIL, the hole transport layer HTL and the hole blocking layer (EBL) fall within the above-mentioned ranges, a suitable or satisfactory hole transport characteristic can be obtained without a substantial increase in driving voltage.

In addition to the above-mentioned materials, the hole transport region HTR may further include a charge generation material for improving conductivity (e.g., electrical conductivity). The charge generation material may be evenly or unevenly dispersed in the hole transport region HTR. The charge generation material may be, for example, a p-dopant. The p-dopant may be, but not limited to, one among quinone derivatives, metal oxides and cyano group-containing compounds. Non-limiting examples of the p-dopant may include, but are not limited to, quinone derivatives such as tetracyanoquinodimethane (TCNQ), 2,3,5,6-tetrafluoro-tetracyanoquinodimethane (F4-TCNQ), metal oxides such as tungsten oxide and molybdenum oxide, and the like.

As mentioned above, the hole transport region HTR may further include at least one selected from a hole buffer layer and an electron blocking layer in addition to the hole injection layer HIL and the hole transport layer HTL. The electron buffer layer EBL may compensate for a resonance distance according to a wavelength of light generated in the light emitting layer EML and thus increase luminous efficiency. The materials included in the hole transport region HTR may be included in the hole buffer layer. The electron blocking layer is a layer to block an electron from entering the hole transport region HTR from the electron transport region ETR.

The light emitting layer EML is provided on the hole transport region HTR. The thickness of the light emitting layer EML may be from, for example, about 100 Å to about 10000 Å, or from about 100 Å to about 300 Å. The light emitting layer EML may have a single layer structure formed using a single material, a single layer structure formed using a plurality of different materials, or a multi-layer structure having a plurality of layers formed using a plurality of different materials.

The light emitting layer EML of the organic electroluminescence device 10 according to an embodiment may include an organometallic complex. The organometallic complex according to an embodiment may include a metal atom which is a central atom, a plurality of ligands connected to the metal atom, and a nitrogen atom connecting two of the plurality of ligands. For example, the metal atom may form a coordinate bond with four ligands.

An organometallic complex according to an embodiment may include a nitrogen atom which connects two among the plurality of ligands and includes an aromatic ring group as a substituent. For example, the aromatic ring group may be a substituted or unsubstituted aryl group or a substituted or unsubstituted heteroaryl group. In some embodiments, the aromatic ring group may be a 6 membered ring group. For example, the aromatic ring group may be a substituted or unsubstituted phenyl group. Also, the aromatic ring group may be a substituted or unsubstituted ring-forming heteroaryl group having 2 or more carbon atoms. For example, the aromatic ring group may be a substituted or unsubstituted ring-forming 6 membered heterocyclic group which includes N as a heteroatom and has 2 or more carbon atoms.

The metal atom in the organometallic complex according to an embodiment may be Pt, Pd, Cu, Ag, Au, Rh, Ir, Ru, or Os. For example, the metal atom may be Pt.

One of the plurality of the ligands in the organometallic complex according to an embodiment may be a substituted or unsubstituted 5 membered heterocyclic group, or may be a substituted or unsubstituted ring-forming C2-30 heteroaryl group. For example, one of the plurality of the ligands in the organometallic complex may be a substituted or unsubstituted 5 membered heterocyclic group having N as a heteroatom.

Also, another one of the plurality of the ligands connected to the metal atom may be a substituted or unsubstituted ring-forming C6-30 aryl group, or a substituted or unsubstituted ring-forming C2-30 heteroaryl group. For example, another one of the plurality of the ligands may be a substituted or unsubstituted pyridine or a substituted or unsubstituted benzene ring. In some embodiments, the substituted benzene ring may be a benzene ring substituted with a phenyl group which is substituted with a 2,4,6-trimethyl group.

In the present disclosure, unless defined otherwise, the term "substituted or unsubstituted" may indicate being substituted or unsubstituted with one or more of substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Also, each of the above-mentioned substituents may be substituted or unsubstituted. For example, the biphenyl group may be interpreted as an aryl group or a phenyl group substituted with a phenyl group. The heterocyclic group includes an aliphatic heterocyclic group or an aromatic heterocyclic group (heteroaryl group).

In the present disclosure, an example of the halogen atom is a fluorine atom, a chlorine atom, a bromine atom, or an iodine atom.

In the present disclosure, the alkyl group may have a straight chain, branched chain form or an annular form. The number of carbon atoms included in the alkyl group may be 1 to 30, 1 to 20, 1 to 10 or 1 to 5. Examples of the alkyl group may include a methyl group, an ethyl group, a n-propyl group, an isopropyl group, a n-butyl group, an s-butyl group, a t-butyl group, an i-butyl group, a 2-ethyl butyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, a n-heptyl group, a 1-methylheptyl group, a 2,2-dimethyl heptyl group, a 2-ethylheptyl group, a 2-butylheptyl group, a n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyl decyl group, a 2-hexyl decyl group, a 2-octyl decyl group, an n-undecyl group, an n-dodecyl group, a 2-ethyl dodecyl group, a 2-butyl dodecyl group, a 2-hexyl dodecyl group, a 2-octyl dodecyl group, an n-tridecyl group, an n-tetradecyl group, an n-pentadecyl group, an n-hexadecyl group, a 2-ethylhexadecyl group, a 2-butylhexadecyl group, a 2-hexyl hexadecyl group, a 2-octyl hexadecyl group, an n-heptadecyl group, an n-octadecyl group, an n-nonadecyl group, an n-icosyl group, a 2-ethylicosyl group, a 2-butylicosyl group, a 2-hexylicosyl group, a 2-octylicosyl group, an n-hencosil group, an n-docosyl group, an n-tricosyl group, an n-tetracosyl group, an n-pentacosyl group, an n-hexacosyl group, an n-heptacosyl group, an n-octacosyl group, an n-nonacosyl group, and n-triacontyl group, but are not limited thereto.

In the present disclosure, the aryl group refers to a functional group or a substituent derived from the aromatic hydrocarbon ring. The aryl group may be a single cyclic aryl group or a polycyclic aryl group. The number of ring-forming carbon atoms included in the aryl group may be 6-60, 6-30, 6-20, or 6-15. Examples of the aryl group may include a phenyl group, a naphthyl group, a fluorenyl group, a anthracenyl group, a phenanthryl group, a biphenyl group, a terphenyl group, a quarterphenyl group, a quinquephenyl group, a sexyphenyl group, a biphenylene group, a triphenylene group, a pyrenyl group, a benzo fluoranthenyl group, and a chrysnil group, but are not limited thereto.

In present disclosure, the heteroaryl group may include one or more B, O, N, P, Si or S as heteroatoms. When the heteroaryl group includes 2 or more heteroatoms, the 2 or more heteroatoms may be the same or different. The heteroaryl group may be a monocyclic heterocyclic group or a polycyclic heterocyclic group. The number of ring-forming carbon atoms included in the heteroaryl group may be 2-30, 2-20, or 2-10. Examples of the heteroaryl group may include a thiophene group, a furan group, a pyrrole group, an imidazole group, a thiazole group, an oxazole group, an oxadiazole group, a triazole group, a pyridine group, a bipyridine group, a pyrimidine group, a triazine group, a triazole group, an acridil group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxoxazole group, an oxadiazole group, a thiadiazole group, a phenothiazine group, a dibenzosilol group, and a dibenzofuran group, but are not limited thereto.

In the present disclosure, the expression "binding to an adjacent group to form a ring" may indicate binding to an adjacent group to form a substituted or unsubstituted hydrocarbon ring, or a substituted or unsubstituted hetero ring. The hydrocarbon ring includes an aliphatic hydrocarbon ring and an aromatic hydrocarbon ring. The hetero ring includes an aliphatic hetero ring and an aromatic hetero ring. The hydrocarbon ring and hetero ring may be monocyclic or polycyclic. Also, a ring formed by binding to each other may bind to another ring to form a spiro structure.

In the present disclosure, the term "adjacent group" may refer to a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the present disclosure, "—*—*" refers to positions connected to neighboring parts.

The light emitting layer EML of the organic electroluminescence device 10 according to an embodiment may include an organometallic compound represented by formula 1 below.

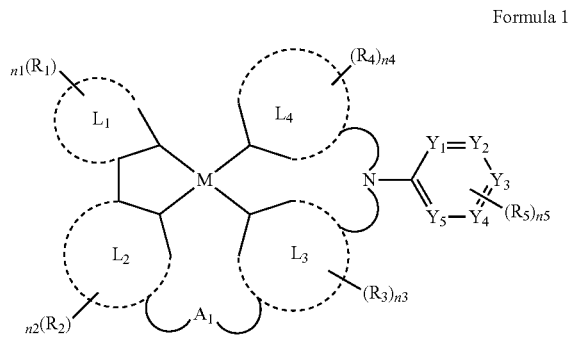

Formula 1

In formula 1 above, M is Pt, Pd, Cu, Ag, Au, Rh, Ir, Ru or Os. For example, M may be Pt.

$L_1$ is a substituted or unsubstituted 5 membered heterocyclic group, or a substituted or unsubstituted ring-forming C2-30 heteroaryl group. In some embodiments, $L_1$ may be a substituted or unsubstituted 5 membered heterocyclic group which includes N as a heteroatom.

$L_2$, $L_3$, and $L_4$ are each independently a substituted or unsubstituted ring-forming C6-30 aryl group, or a substituted or unsubstituted ring-forming C2-30 heteroaryl group. For example, when $L_2$ and $L_3$ are the aryl group, the aryl group may be a 6 membered ring such as, for example, a substituted or unsubstituted benzene ring. Also, when $L_4$ is a heteroaryl group, the heteroaryl group may include N in the aromatic 6 membered ring and may be, for example, a pyridine.

$R_1$, $R_2$, $R_3$, and $R_4$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, an cyano group, an alkoxy group, an ester group, a sulfonic acid group, a carboxyl group, or a silyl group, and at least some of $R_1$, $R_2$, $R_3$, or $R_4$ may bind to an adjacent group to form a ring. For example, $R_1$, $R_2$, $R_3$, and $R_4$ are each independently a substituted or unsubstituted methyl group, or a substituted or unsubstituted phenyl group.

In some embodiments, when at least some of $R_1$, $R_2$, $R_3$ or $R_4$ bind to an adjacent group to form a ring, $R_1$, $R_2$, $R_3$ and $R_4$ do not bind to an aromatic ring which is a substituent for a nitrogen atom which connects $L_3$ and $L_4$. In other words, $R_1$, $R_2$, $R_3$ and $R_4$ do not bind to $Y_1$ to $Y_5$ which are included in the aromatic ring, and do not bind to $R_5$ which is a substituent to the aromatic ring group. For example, $R_1$ may bind to $R_2$ and/or $R_4$. $R_2$ may bind to $R_1$ and/or $R_3$. $R_3$ may bind to $R_2$. $R_4$ may bind to $R_1$.

$R_5$ is a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group, and in case of a plurality of $R_5$'s may bind to each other to form a ring. For example, $R_5$ may be a substituted or unsubstituted phenyl group, a substituted or unsubstituted dibenzofuran, or a substituted or unsubstituted naphthyl group.

$n_1$ to $n_4$ may be each independently an integer from 0 to 3. When $n_1$ is an integer of 2 or more, a plurality of $R_1$'s may be the same as or different from each other. When $n_2$ is an integer of 2 or more, a plurality of $R_2$'s may be the same as or different from each other. When $n_3$ is an integer of 2 or more, a plurality of $R_3$'s may be the same as or different from each other. When $n_4$ is an integer of 2 or more, a plurality of $R_4$'s may be the same as or different from each other. For example, $n_1$ to $n_4$ may be 1.

$n_5$ may be an integer from 0 to 5. When $n_5$ is an integer of 2 or more, a plurality of $R_5$'s may be the same as or different from each other.

$Y_1$, $Y_2$, $Y_3$, $Y_4$, and $Y_5$ may each independently be C, N, O, or S. For example, at least two of $Y_1$, $Y_2$, $Y_3$, $Y_4$, and $Y_5$ may be C.

$A_1$ may be *—O—*, *—S—*, *—S(=O)—*, *—SO$_2$—*, *—Se—*, *—NR$_{11}$—*, *—R$_{11}$P=O*, *—CR$_{12}$R$_{13}$—, —*, *—C(=O)*, *—SIR$_{12}$R$_{13}$—, —*, *—GeR$_{12}$R$_{13}$*, *—BH*, *—P(O)H*, *—PH—*, *—NH—*, *—CR$_{12}$H—*, *—CH$_2$—*, *—SiH$_2$—*, *—SiHR$_{12}$—*, *—BR$_{14}$—*, or *—PR$_{14}$—*. For example, $A_1$ may be *—O—* or *—NR$_{11}$—*.

$R_{11}$, $R_{12}$, $R_{13}$, and, $R_{14}$ may each independently be a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group, and may bind to an adjacent group to form a ring. For example, $R_{11}$ may be a substituted or unsubstituted phenyl group.

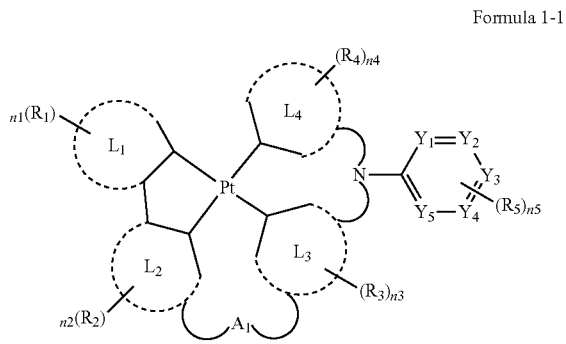

Formula 1-1

Formula 1-1 above represents formula 1 in which M is Pt. In formula 1-1 above, $L_1$ to $L_4$, $R_1$ to $R_5$, $n_1$ to $n_5$, $A_1$, $R_{11}$ to $R_{14}$ and $Y_1$ to $Y_5$ may be the same as those explained referring to formula 1.

In the organometallic complex according to an embodiment, the organometallic complex represented by formula 1 above may be represented by formula 1-2 below.

Formula 1-2

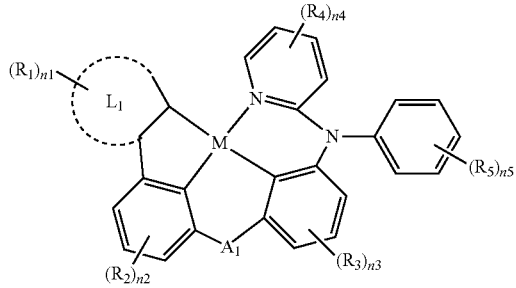

Formula 1-2 represents formula 1 in which $L_2$ and $L_3$ are benzenes, $L_4$ is a pyridine, and $Y_1$ to $Y_5$ are C.

In formula 1-2 above, M, $L_1$, $R_1$ to $R_5$, $n_1$ to $n_5$, $A_1$, and $R_{11}$ to $R_{14}$ may be the same as those explained referring to formula 1.

In the organometallic complex according to an embodiment, the organometallic complex represented by formula 1 above may be represented by formula 1-3 below.

Formula 1-3

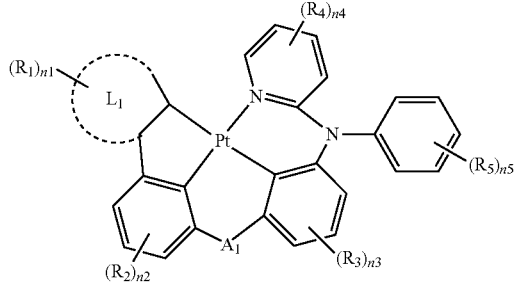

Formula 1-3 above represents formula 1-2 in which M is Pt.

In formula 1-3 above, $L_1$, $R_1$ to $R_5$, $n_1$ to $n_5$, $A_1$, and $R_{11}$ to $R_{14}$ may be the same as those explained referring to formula 1.

In the organometallic complex according to an embodiment, the organometallic complex represented by the above formula 1 may include at least one of the compounds represented by compound group 1 below.

Compound group 1

1

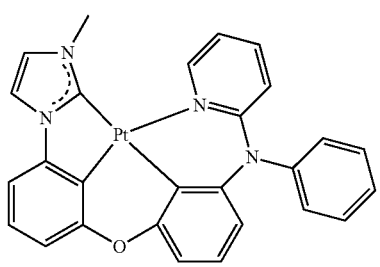

2

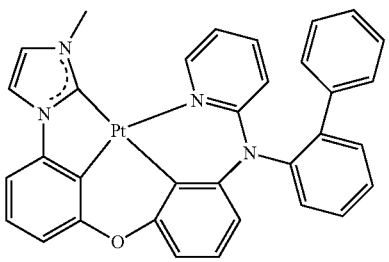

3

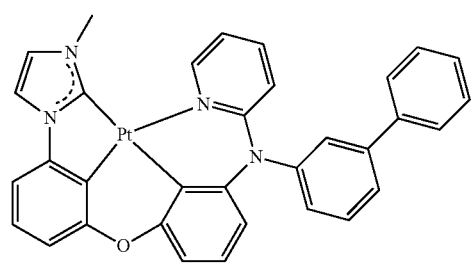

4

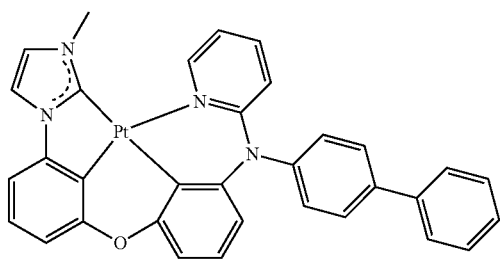

5

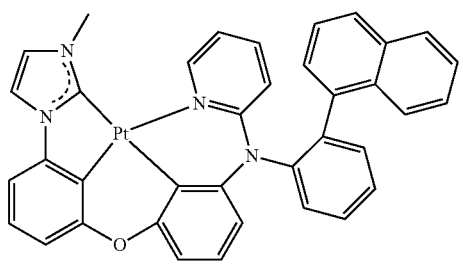

6

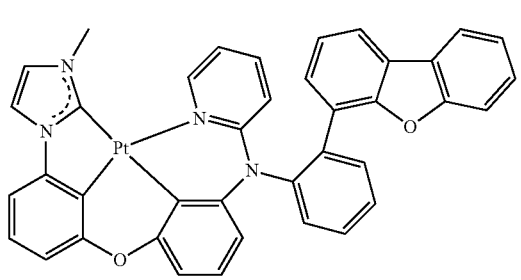

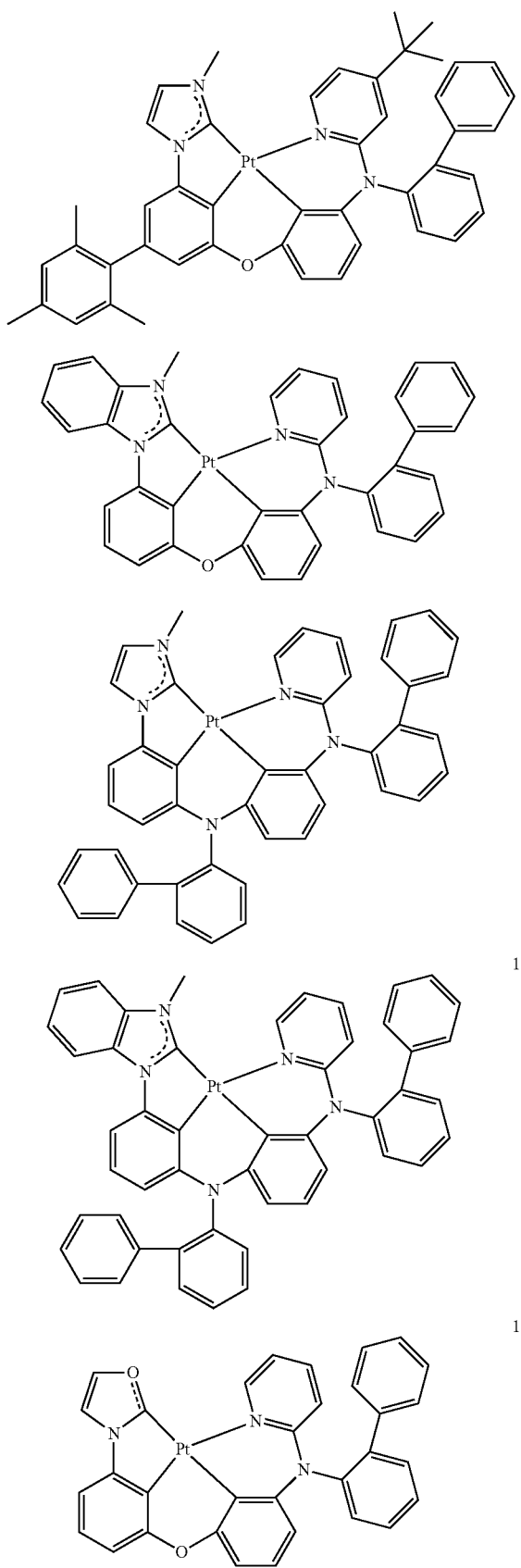
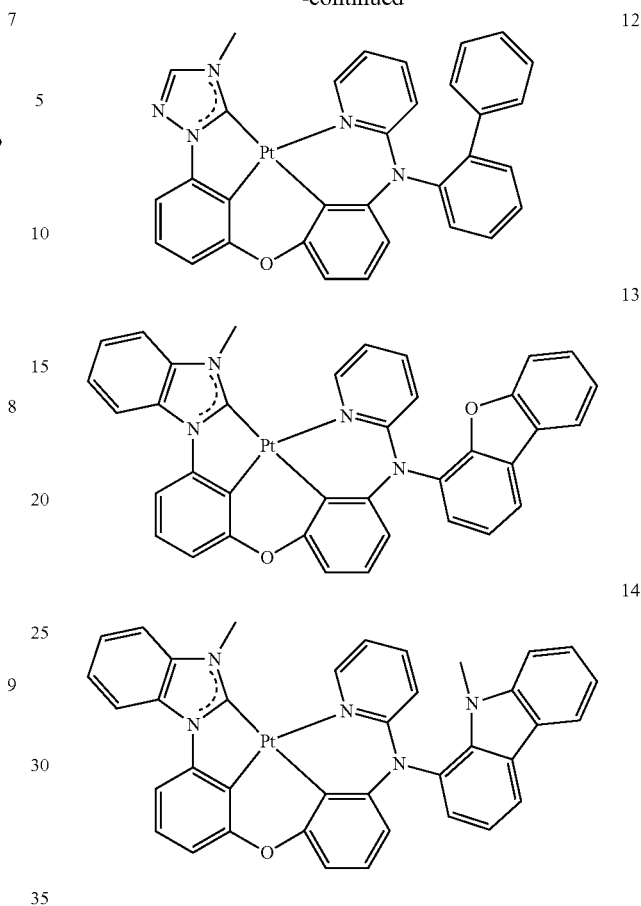

In the organic electroluminescence device 10 according to an embodiment illustrated in FIG. 1 to FIG. 4, the light emitting layer EML may include a host material and a dopant material, and the light emitting layer EML may include the organometallic complex, represented by formula 1, as a dopant material.

The organometallic complex according to an embodiment may be a phosphorescence dopant. The light emitting layer EML may emit light by phosphorescence emission.

The light emitting layer EML may include one or more kinds of organometallic complexes in the above-mentioned compound group. The light emitting layer EML may include any suitable material available in the art in addition to the above-mentioned organometallic complexes.

The light emitting layer EML may employ any suitable material available in the related art as a host material without limitation. For example, the light emitting layer EML may include at least one of Bis[2-(diphenylphosphino)phenyl] ether oxide (DPEPO), 4,4'-Bis(carbazol-9-yl)biphenyl), mCP(1,3-Bis(carbazol-9-yl)benzene (CBP), 2,8-Bis(diphenylphosphoryl)dibenzo[b,d]furan (PPF), 4,4', 4"-Tris(carbazol-9-yl)-triphenylamine (TcTa), and 1,3,5-tris(N-phenylbenzimidazole-2-yl)benzene (TPBi), but the examples are not limited thereto. For example, the light emitting layer EML may further include tris(8-hydroxyquinolino)aluminum (Alq3), 4,4'-bis(N-carbazolyl)-1,1'-biphenyl (CBP), poly(n-vinylcabazole (PVK), 9,10-di(naphthalene-2-yl)anthracene (ADN), 4,4', 4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2, 2'-dimethyl-biphenyl (CDBP), 2-Methyl-9,10-bis(naphthalen-2-yl)anthracene (MADN), bis[2-(diphenylphosphino)phenyl]ether oxide (DPEPO), Hexaphenyl cyclotriphosphazene (CP1), 1,4-Bis(triphenylsilyl)benzene (UGH2), Hexaphenylcyclotrisiloxane (DPSiO3), Octaphenylcyclotetra siloxane (DPSiO4), 2,8-Bis(diphenylphosphoryl)dibenzofuran (PPF), etc., as a host material.

The light emitting layer EML of the organic electroluminescence device 10 according to an embodiment may further include any suitable dopant material available in the art in addition to the above-mentioned organometallic complexes according to an embodiment.

The light emitting layer EML according to an embodiment may further include styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), perylene and derivatives thereof (for example, 2, 5, 8, 11-Tetra-t-butylperylene (TBP)), pyrene and derivatives thereof (for example, 1, 1-dipyrene, 1, 4-dipyrenylbenzene, 1, 4-Bis(N, N-Diphenylamino)pyrene), and/or other suitable material.

In the organic electroluminescence device 10 according to an embodiment illustrated in FIGS. 1 to 3, the electron transport region ETR is provided on the light emitting layer EML. The electron transport region ETR may include any one of hole blocking layer HBL, electron transport layer ETL, and electron injection layer EIL, but the embodiment is not limited thereto.

The electron transport region ETR may have a single layer structure formed using a single material, a single layer structure formed using a plurality of different materials, or a multilayer structure formed using a plurality of different materials.

For example, the electron transport region ETR may have a single layer structure of an electron injection layer EIL or an electron transport layer ETL, or have a single layer structure formed using an electron injection material and electron transport material. Also, the electron transport region ETR may have a single layer structure formed using a plurality of different materials or have a structure of electron transport layer ETL/electron injection layer EIL, or hole blocking layer HBL/electron transport layer ETL/electron injection layer EIL which are laminated in this order from the light emitting layer EML, but the structure of the electron transport region ETR is not limited thereto. For example, the thickness of the electron transport region ETR may be from about 1000 Å to about 1500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include, but is not limited to, an anthracene-based compound. The electron transport region ETR, for example, may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis (benzoquinolin-10-olate (Bebq2), 9,10-di(naphthalene-2-yl)anthracene (ADN), or a mixture thereof. The thickness of the electron transport layer ETL may be from about 100 Å to about 1000 Å. For example, the thickness may be from about 150 Å to about 500 Å. When the thickness of the electron transport layer ETL falls within the above-mentioned range, a suitable or satisfactory hole transport characteristic can be obtained without a substantial increase in driving voltage.

When the electron transport region ETR includes the electron injection layer EIL, the electron transport region ETR may employ a metal halide such as LiF, NaCl, CsF, RbCI, and Rbl, a lanthanum metal such as Yb, a metal oxide such as $Li_2O$ and BaO, or a Lithium quinolate (LiQ), but the examples are not limited thereto. The electron injection layer EIL may be formed of a mixture of the electron transport material and an organo metal salt which has insulating property. The organo metal salt may be a material with an energy band gap of 4 eV or higher. For example, the organo metal salt may include a metal acetate, a metal benzoate, a metal acetoacetate, a metal acetylacetonate or a stearate. The thickness of the electron injection layer EIL may be from about 1 Å to about 100 Å, or about 3 Å to about 90 Å. When the thickness of the electron injection layer falls within the above-mentioned range, a suitable or satisfactory hole transport feature can be obtained without a substantial increase in driving voltage.

As mentioned above, the electron transport region ETR may include the hoe blocking layer HBL. For example, the hole blocking layer may include at least one of 2,9-dimethyl-4,7-diphenyl-1, 10-phenanthroline (BCP) or 4,7-diphenyl-1,10-phenanthroline (Bphen), but the examples are not limited thereto.

The second electrode EL2 is provided on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide such as indium tin oxide (ITO), indium zinc oxide(IZO), zinc oxide(ZnO), indium tin zinc oxide(ITZO), and/or other suitable material.

When the second electrode EL2 is a transflective electrode, or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti or a compound or a mixture (for example, a mixture of Ag and Mg) thereof. In some embodiments, the second electrode EL2 may have a multilayer structure including a reflective film or a transflective film formed of the above material and a transparent conductive film formed of indium tin oxide (ITO), indium zinc oxide (IZO), zinc oxide (ZnO), indium tin zinc oxide (ITZO), and/or other suitable material.

In some embodiments, the second electrode EL2 may be connected to an auxiliary electrode. When the second electrode EL2 is connected to the auxiliary electrode, the resistance of the second electrode EL2 may be reduced.

As shown in FIG. 4, the capping layer CPL may be further on the second electrode EL2 of the organic electroluminescence device 10 according to an embodiment. The capping layer CPL may include, for example, α-NPD, NPB, TPD, m-MTDATA, $Alq_3$, CuPc, N4,N4,N4',N4'-tetra (biphenyl-4-yl) biphenyl-4,4'-diamine (TPD15), 4,4', 4"-Tris (carbazol sol-9-yl) triphenylamine (TCTA), N,N'-bis (naphthalen-1-yl), and/or other suitable material.

The organic electroluminescence device 10 according to an embodiment of the present disclosure may include the above-mentioned organometallic complex in at least one of the organic layers between the first electrode EL1 and the second electrode EL2 or in the capping layer CPL on the second electrode EL2.

In the organic luminescence device 10, as voltage is applied to each of the first electrode EL1 and the second electrode EL2, holes injected from the first electrode EL1 move to the light emitting layer EML via the hole transport region HTR, and electrons injected from the second electrode EL2 move to the light emitting layer EML via the electron transport region ETR. The electrons and holes recombine in the light emitting layer EML to generate excitons, and light is emitted when the excitons falls (e.g., transitions) from an excited status to a ground status.

The above explanation about the organic electroluminescence device 10 according to an embodiment mostly focuses on an embodiment in which the organometallic complex according to an embodiment is included in the light emitting layer EML. However, the present disclosure is not limited thereto. The organometallic complex may be included in at least one of the other organic layers or in the capping layer CPL on the second electrode EL2. For example, the organometallic complex may be included in the hole transport region HTR or the electron transport region ETR.

According to an embodiment, the organic electroluminescence device 10 includes the organometallic complex of the light emitting layer EML includes a metal atom which is a central atom, a plurality of ligands connected to the metal atom, and a nitrogen atom connecting any two of the plurality of ligands. Because the organometallic complex has a structure in which the nitrogen atom includes the aromatic ring group as a substituent and the aromatic ring group does not bind to the plurality of ligands to form a ring, the nitrogen atom can increase the binding stability between the central atom and the ligands. Therefore, compared to a case in which an organometallic complex is used in which an aromatic ring group substituted for a nitrogen atom forms a ring with other ligands, the organic electroluminescence device according to an embodiment of the present disclosure may have improved life time and lower driving voltage characteristics.

Hereinafter, an organometallic complex according to an embodiment of the present disclosure, an organic electroluminescence device10 according to an embodiment, and an organometallic complex used for the organic electroluminescence device 10 will be specifically described with reference to examples and comparative examples. Also, the examples below are only provided to help understanding of the present disclosure and the scope of the present disclosure is not limited thereto.

EXAMPLE

1. Synthesis of Organometallic Complex

An organometallic complex according to an embodiment of the present disclosure, for example, may be synthesized as follows. However, the synthesis of the organometallic complex according to an embodiment of the present disclosure is not limited thereto.

Synthesis Example 1: Synthesis of Compound 1

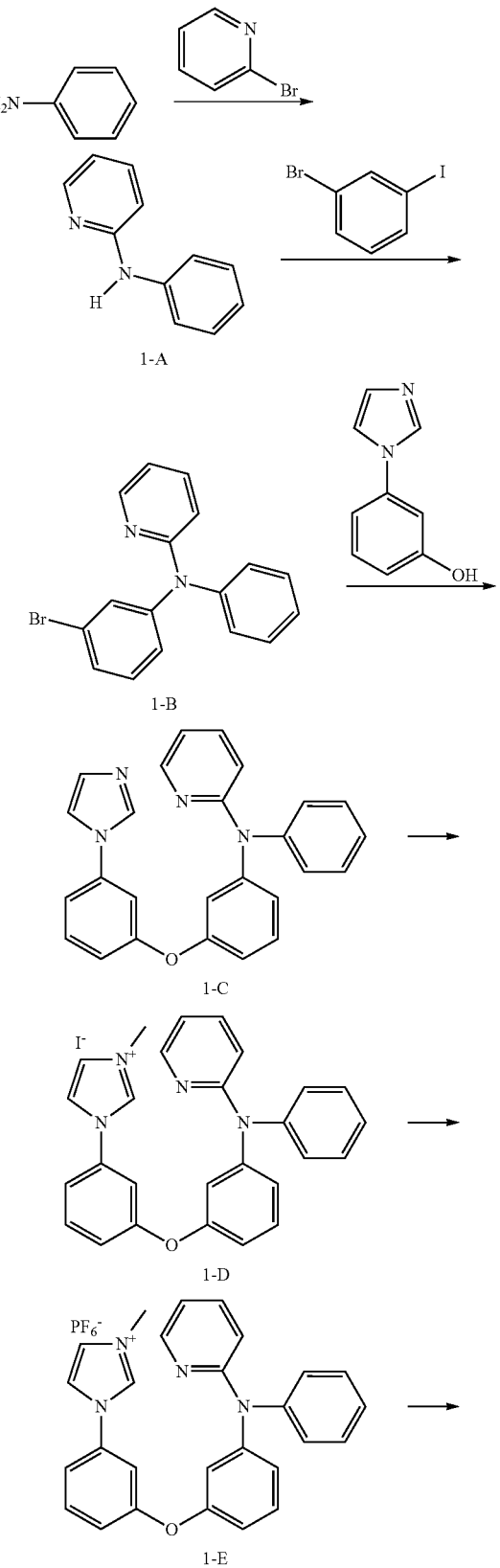

-continued

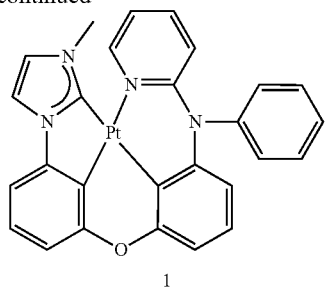

1

1) Synthesis of Intermediate [1-A]

Aniline 1.00 g (10.7 mmol), 2-bromopyridine 1.70 g (10.7 mmol), PdCl$_2$(dppf) ([1,1'-Bis(diphenylphosphino)ferrocene]dichloropalladium(II)) 782.9 mg (1.07 mmol), and NaOt-Bu 1.54 g (16.5 mmol) were suspended in 100 ml of a dioxane solvent, heated to about 100° C. and stirred for about 12 hours. A reaction compound was extracted by using dichloromethane and distilled water. The resultant organic layer was washed three times with distilled water, dried with magnesium sulfate, filtered and concentrated under reduced pressure. The concentrate was separated by column chromatography to obtain intermediate [1-A] with 70% yield.

2) Synthesis of Intermediate [1-B]

The synthesized Intermediate [1-A], 1-bromo-3-iodobenzene (1.0 eq), PdCl$_2$(dppf) (0.1 eq), and NaOt-Bu (1.5 eq) were suspended in 100 ml of dioxane solvent, heated to about 100° C. and stirred for about 12 hours. A reaction compound was extracted by using dichloromethane and distilled water. The resultant organic layer was washed three times with distilled water, dried with magnesium sulfate, filtered and concentrated under reduced pressure. The concentrate was separated by column chromatography to obtain the intermediate [1-B] with 70% yield.

3) Synthesis of Intermediate [1-C]

The synthesized Intermediate [1-B], 3-(1H-imidazol-1-yl)phenol (1.0 eq), copper iodide (0.1 eq), Potassium Phosphate (2.0 eq), and L-proline (0.1 eq) were suspended in 100 ml of dimethyl formamide solvent, heated to about 120° C. and stirred for about 12 hours. A reaction compound was extracted by using dichloromethane and distilled water. The resultant organic layer was washed three times with distilled water, dried with magnesium sulfate, filtered and concentrated under reduced pressure. The concentrate was separated by column chromatography to obtain the intermediate [1-C] with 70% yield.

4) Synthesis of Intermediate [1-D]

The synthesized intermediate [1-C] was dissolved in acetone, iodomethane (1.2 eq) was added thereto, and stirred for about 24 hours in room temperature. After termination of reaction, the pressure was lowered to remove the solvent, and the concentrate was separated by column chromatography to obtain Intermediate [1-D] with 80% yield.

5) Synthesis of Intermediate [1-E]

The synthesized intermediate [1-D] was dissolved in a solvent mixture of methanol and distilled water (4:1), and ammonium hexafluorophosphate(2 eq) was added thereto. A produced solid was stirred for about 12 hours in room temperature. The solid was filtered and washed with diethyl ether to obtain Intermediate [1-E] to with 90% yield.

6) Synthesis of Compound 1

The synthesized Intermediate [1-E], sodium acetate (3.0 eq), and Pt(COD)C12(Dichloro(1,5-cyclooctadiene)platinum(II)) (1.1 eq) were suspended in 1,4-dioxane solvent. A reaction compound was heated to about 120° C. and stirred for about 12 hours. After termination of reaction, the pressure was lowered to remove solvent, and the concentrate was separated by column chromatography to obtain Compound 1 with 40% yield.

Synthesis Example 2: Synthesis of Compound 2

Compound 2 was obtained by using substantially the same method as in the synthesis example 1 except using [1,1'-biphenly]-2-amine instead of aniline.

Synthesis Example 3: Synthesis of Compound 3

Compound 3 was obtained by using substantially the same method as in the synthesis example 1 except using [1,1'-biphenly]-2-amine instead of aniline.

Synthesis Example 4: Synthesis of Compound 4

Compound 4 was obtained by using substantially the same method as in the synthesis example 1 except using [1,1'-biphenly]-2-amine instead of aniline.

Synthesis Example 5: Synthesis of Compound 5

Compound 5 was obtained by using substantially the same method as in the synthesis example 1 except using 2-(naphthalene-1-yl)aniline instead of aniline.

Synthesis Example 6: Synthesis of Compound 6

Compound 6 was obtained by using substantially the same method as in the synthesis example 1 except using 2-(naphthalene-1-yl)aniline instead of aniline.

Synthesis Example 7: Synthesis of Compound 7

Compound 7 was obtained by using substantially the same method as in the synthesis example 1 except using [1,1'-biphenly]-2-amine instead of aniline, 2-bromo-4-(tert-butyl)pyridine instead of 2-bromopyridine, and 1-(5-bromo-2', 4', 6'-trimethyl-[1,1'-biphenyl]-3-yl)-1H-imidazole instead of 3-(1H-imidazole-1-yl)phenol.

Synthesis Example 8: Synthesis of Compound 8

Compound 8 was obtained by using substantially the same method as in the synthesis example 1 except using [1,1'-biphenly]-2-amine instead of aniline, and 1-(3-bromophenyl)-1H-benzo[d]imidazole instead of 3-(1H-imidazole-1-yl)phenol.

Synthesis Example 9: Synthesis of Compound 9

Compound 9 was obtained by using substantially the same method as in the synthesis example 1 except using

[1,1'-biphenly]-2-amine instead of aniline, and N-(3-(1H-imidazole-1-yl)phenyl)-[1,1'-biphenyl]-2-amine instead of 3-(1H-imidazole-1-yl)phenol.

Synthesis Example 10: Synthesis of Compound 10

Compound 10 was obtained by using substantially the same method as in the synthesis example 1 except using [1,1'-biphenly]-2-amine instead of aniline, and N-(3-(1H-imidazole-1-yl)phenyl)-[1,1'-biphenyl]-2-amine instead of 3-(1H-imidazole-1-yl)phenol.

Synthesis Example 11: Synthesis of Compound 11

Compound 11 was obtained by using substantially the same method as in the synthesis example 1 except using [1,1'-biphenly]-2-amine instead of aniline, and 3-(3-bromophenyl)-3H-113-oxazole instead of 3-(1H-imidazole-1-yl)phenol.

Synthesis Example 12: Synthesis of Compound 12

Compound 12 was obtained by using substantially the same method as in the synthesis example 1 except using [1,1'-biphenly]-2-amine instead of aniline, and 1-(3-bromophenyl)-1H-1,2,4-triazole instead of 3-(1H-imidazole-1-yl)phenol.

Synthesis Example 13: Synthesis of Compound 13

Compound 13 was obtained by using substantially the same method as in the synthesis example 1 except using dibenzo[b,d]furan-4-amine instead of aniline, and N-(3-(1H-benzo[d]imidazole-1-yl)phenyl)-[1,1'-biphenyl]-2-amine instead of 3-(1H-imidazole-1-yl)phenol.

Synthesis Example 14: Synthesis of Compound 14

Compound 14 was obtained by using substantially the same method as in the synthesis example 1 except using 9-methyl-9H-carbazole-1-amine instead of aniline, and N-(3-(1H-benzo[d]imidazole-1-yl)phenyl)-[1,1'-biphenyl]-2-amine instead of 3-(1H-imidazole-1-yl)phenol.

1H NMR and MS/FAB of the synthesized compounds are shown in table 1 below.

TABLE 1

| Compound number | 1H NMR (CDCl3, 400 MHz) | MS/FAB found | Calc. |
|---|---|---|---|
| 1 | δ 8.04 (d, 1H), 7.83 (s, 1H), 7.55 (t, 1H), 6.40-7.38 (m, 15H), 3.73 (s, 3H) | 611.1285 | 611.5680 |
| 2 | 8.10 (d, 1H), 8.04 (d, 1H), 7.55 (t, 1H), 6.30~7.00 (m, 18H), 3.73 (s, 3H) | 687.1598 | 687.6660 |
| 3 | 8.04 (d, 1H), 7.55 (d, 2H), 6.80~7.20 (m, 16H) 6.63 (d, 1H), 6.43 (d, 1H), 3.72 (s, 3H) | 687.1598 | 687.6660 |
| 4 | 8.04 (d, 1H), 7.75 (d, 2H), 6.70~7.20 (m, 16H), 6.63 (d, 1H), 6.43 (d, 1H), 3.72 (s, 3H) | 687.1598 | 687.6660 |
| 5 | 8.95 (d, 1H), 8.50 (d, 1H), 8.20 (d, 1H), 7.95~8.20 (m, 3H), 7.77 (d, 2H), 6.65~7.60 (m, 13 H), 6.63 (d, 1H), 6.43 (d, 1H), 3.72 (s, 3H) | 737.1754 | 737.7265 |
| 6 | 8.10 (d, 1H), 8.08 (d, 1H), 8.04 (d, 1H), 7.98 (d, 1H), 6.85~7.95 (m, 15H), 6.80 (d, 1H), 6.73 (t, 1H), 6.63 (d, 1H), 6.43 (d, 1H), 3.72 (s, 3H) | 777.1704 | 777.7470 |
| 7 | 8.1 (d, 1H), 7.85 (d, 1H), 7.02~7.83 (m, 13H), 7.01 (s, 2H), 6.80 (d, 1H), 6.67 (d, 1H), 6.52 (s, 1H), 6.43 (d, 1H), 3.72 (s, 3H), 2.92 (s, 6H), 2.48 (s, 3H), 1.32 (s, 9H) | 861.3006 | 861.9530 |
| 8 | 8.55 (d, 1H), 8.10 (d, 1H), 8.04 (d, 1H), 7.64 (d, 1H) 6.65~7.62 (m, 17H), 6.63 (d, 1H), 6.43 (d, 1H), 3.87 s, 3H) | 737.1754 | 737.7260 |
| 9 | 8.10 (d, 1H), 8.08 (d, 1H), 8.04 (d, 1H), 7.55 (d, 1H), 6.65~7.58 (m, 25), 6.63 (d, 1H), 3.72 (s, 3H) | 838.2384 | 838.8780 |
| 10 | 8.56 (d, 1H), 8.10 (d, 1H), 8.08 (d, 1H), 8.04 (d, 1H), 7.64 (d, 1H), 7.66 (t, 1H), 6.75~7.65 (m, 22H), 6.74 (d, 1H), 6.73 (d, 1H), 6.72 (t, 1H), 6.63 (d, 1H), 3.87 (s, 3H) | 888.2540 | 888.9380 |
| 11 | 8.10 (d, 1H), 8.04 (d, 1H), 7.60 (d, 1H), 7.55 (t, 1H), 6.82~7.53 (m, 13H), 6.80 (d, 1H), 6.74 (t, 1H), 6.63 (d, 1H), 6.43 (d, 1H) | 674.1282 | 674.6230 |
| 12 | 8.74 (s, 1H), 8.10 (d, 1H), 8.04 (d, 1H), 7.55 (t, 1 H), 6.82~7.50 (m, 12H), 6.80 (d, 1H), 6.73 (t, 1H), 6.63 (d, 1H), 6.43 (d, 1H), 3.72 (s, 3H) | 688.1550 | 688.6540 |
| 13 | 8.56 (d, 1H), 8.04 (d, 1H), 7.98 (d, 1H), 7.64 (d, 1H), 7.62 (d, 1H), 7.54 (d, 1H), 6.90~7.50 (m, 11H), 6.80 (d, 1H), 6.73 (t, 1H), 6.60 (d, 1H), 6.43 (d, 1H), 3.87 (s, 3H) | 751.1547 | 751.7090 |
| 14 | 8.56 (d, 1H), 8.34 (d, 1H), 8.04 (d, 1H), 7.83 (d, 1H), 7.77 (d, 1H), 7.64 (d, 1H), 7.55 (t, 1H), 7.41 (t, 1H), 6.85~7.40 (m, 7H), 6.81 (d, 1H), 6.73 (t, 1H), 6.63 (d, 1H), 6.57 (d, 1H), 6.43 (d, 1H), 6.39 (t, 1H), 3.87 (s, 3H), 3.825 (s, 3H) | 764.1863 | 764.7520 |

2. Calculation of Energy Level of the Organometallic Complex.

The energy levels of organometallic complexes of example Compounds 1, 2, 3, 8 and comparative example Compound C1 were measured and shown in table 2 below.

Example Compounds

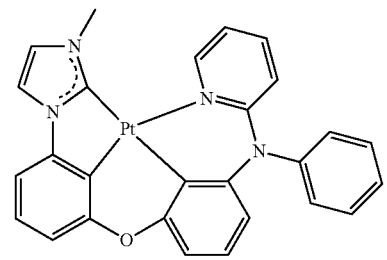
1

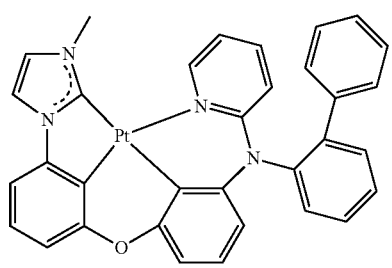
2

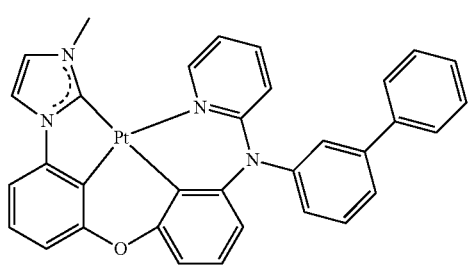
3

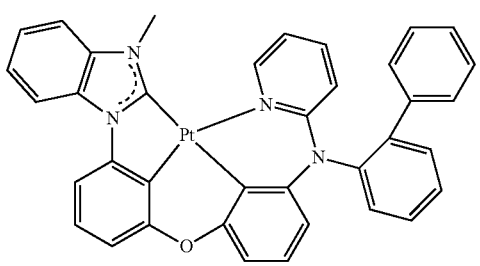
8

Comparative Example Compound C1

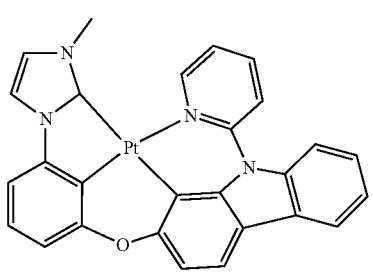
C1

TABLE 2

| Type of Compounds | $^3$MLCT (ratio) | Wavelength (nm) | $^3$MC (eV) | Bond dissociation energy (kcal/mol) |
|---|---|---|---|---|
| Compound 1 | 10.9% | 455 | 0.82 | 30.5 |
| Compound 2 | 15.1% | 450 | 0.85 | 35.0 |
| Compound 3 | 13.2% | 458 | 0.85 | 36.9 |
| Compound 8 | 15.5% | 450 | 0.98 | 37.0 |
| Comparative example compound C1 | 10.1% | 455 | 0.70 | 30.0 |

It can be confirmed that the example compounds, which are Compound 1, 2, 3, and 8 have center emission wavelengths similar to the comparative example compound C1, but have increased metal to ligand charge transfer ($^3$MLCT) ratios and 3 metal centered states ($^3$MC) compared to the comparative example Compound C1.

Also, it can be confirmed that the example compounds have an increased bond dissociation energy compared with comparative example compound C1. Accordingly, when the example compounds are employed in the light emitting device, improved device life time and luminous efficiency may be expected.

3. Manufacturing and Evaluation of Organic Electroluminescence Device Including Organometallic Complex.

Manufacturing of Organic Electroluminescence Device

An organic electroluminescence device according to an embodiment including an organometallic complex according to an embodiment was manufactured by using a method described below.

EXAMPLE

Example 1

For a substrate and an anode, a Corning 15 Ω/cm$^2$ (1200 Å) ITO glass substrate was cut into a size of 50 mm×50 mm×0.7 mm and washed by sonicating in isopropyl alcohol and deionized water for 5 minutes each, washed in UV ozone for 30 minutes, and was placed on a vacuum depositing device.

On the upper surface of the ITO anode formed on the upper glass substrate, a hole injection layer having a thickness of about 600 Å was formed by vacuum-depositing 2-TNATA, and on the upper surface of the hole injection layer, a hole transport layer having a thickness of about 300 Å was formed by vacuum-depositing NPB.

A light emitting layer having a thickness of about 300 Å was formed by vacuum-depositing BCPDS and POPCPA (weight ratio of PCPDS and POPCPA is 90:10) which are co-host materials, and Compound 1 which is a dopant material on the upper surface of the hole transport layer. The weight ratio of the co-host materials and the dopant material was about 90:10.

An organic electroluminescence device was manufactured by forming a hole blocking layer having a thickness of about 50 Å by depositing TSPO1 on the upper surface of the light emitting layer, forming an electron transport layer having a thickness of about 300 Å by depositing Alq$_3$ on the upper surface of the hole blocking layer, then forming an electron injection layer having a thickness of about 10 Å by depositing LiF on the upper surface of the electron transport layer, and then forming a cathode having a thickness of about 3000 Å by vacuum-depositing Al on the upper surface of the electron injection layer.

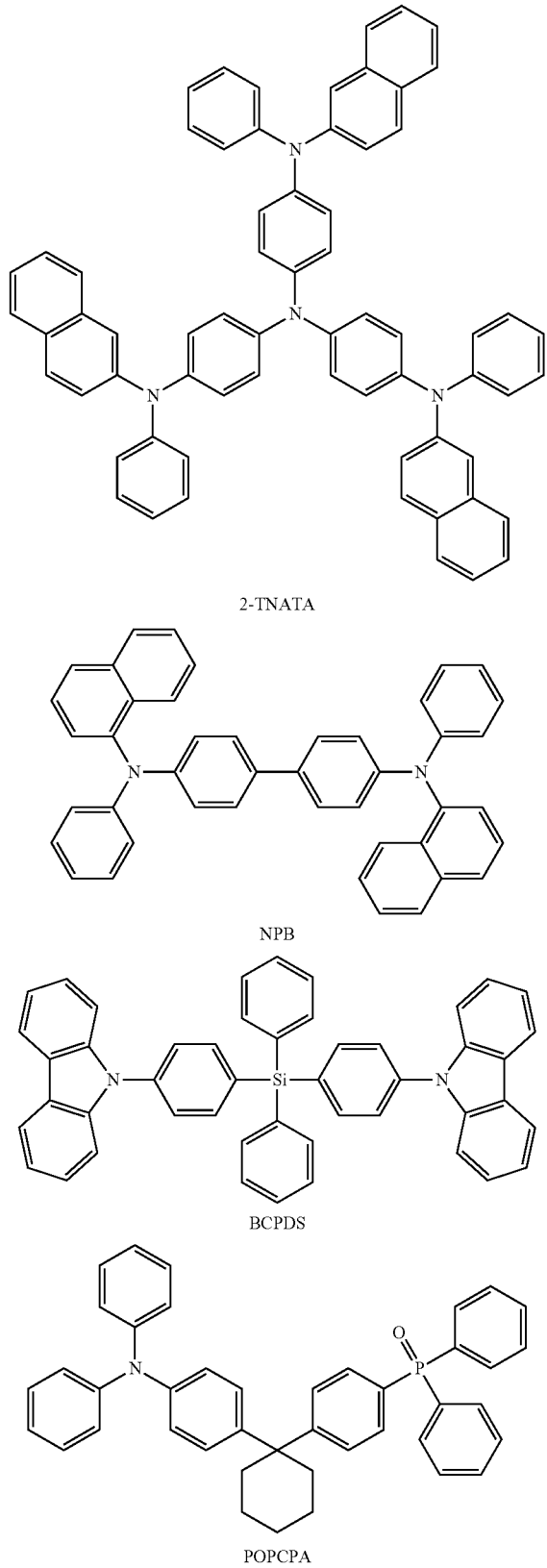

2-TNATA

NPB

BCPDS

POPCPA

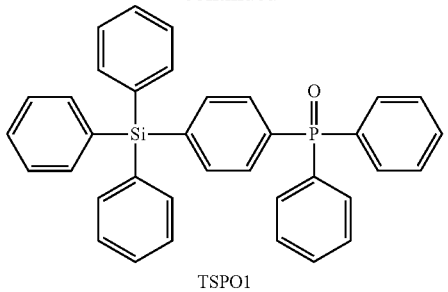

TSPO1

Examples 2 to 4 and Comparative Example 1

Organic electroluminescence devices were manufactured by using substantially the same method as example 1 except that the compounds illustrated in Table 1 were respectively used instead of Compound 1 as a dopant material when forming light emitting layers.

Characteristic Evaluation of Organic Electroluminescence Devices

TABLE 3

| Contents | Material in the Light emitting layer | Driving Voltage | Current Density (mA/cm$^2$) | Luminous Efficiency (cd/A) | Lifetime LT80 (h) |
|---|---|---|---|---|---|
| Example 1 | Compound 1 | 5.20 | 50 | 15.65 | 35 |
| Example 2 | Compound 2 | 4.88 | 50 | 17.20 | 40 |
| Example 3 | Compound 3 | 4.87 | 50 | 15.78 | 42 |
| Example 4 | Compound 8 | 4.52 | 50 | 20.50 | 45 |
| Comparative Example 1 | Comparative example compound C1 | 5.42 | 50 | 15.50 | 33 |

Table 3 illustrates evaluation results of the organic electroluminescence devices of Examples 1 to 4 and Comparative example 1. Table 3 illustrates driving voltage, current density, luminous efficiency, and life time of the manufactured organic electroluminescence devices for comparison with each other. The luminous efficiency indicates a current efficiency value for current density of 50 mA/cm$^2$. The life time was measured by measuring the time taken for the initial luminance to be reduced by 95% (half life time).

With reference to Table 3, the organic electroluminescence devices of Examples 1 to 4 have lower driving voltage, and increased luminous efficiency and lifetime compared to the organic electroluminescence device of Comparative example 1.

When referring to the evaluation results of the compounds and the organic electroluminescence devices of the Examples, it may be confirmed that the compounds in embodiments each have a metal atom as a central atom, include a nitrogen atom connecting two of a plurality of ligands connected to the metal atom, wherein the nitrogen atom includes an aromatic ring group as a substituent, and the aromatic ring group and the plurality of ligands do not bind to each other to form a ring, and such a stable structure is confirmed to result in a improved life time and low voltage feature.

As an example, the organometallic complex according to an embodiment of the present disclosure has a structure in which an amine, known to have high electron donating ability, is included as a linker instead of a conventionally used carbazole, and such a structure may lead to enhanced bonding between the metal and the ligand, thereby improving life time and lowering driving voltage. Also, the organic electroluminescence device according to an embodiment including the compound according to an embodiment in the light emitting layer may has higher luminous efficiency, increased life time and lower driving voltage.

As described above, the organic electroluminescence device according to an embodiment may have improved luminous efficiency and life time.

When the organometallic complex according to an embodiment is incorporated in the light emitting layer of the organic electroluminescence device, the organometallic complex may contribute to improvement of luminous efficiency and life time of organic electroluminescence device.

Although the subject matter of the present disclosure has been described with reference to specific embodiments of the present disclosure, it will be understood by those skilled in the art that various modifications and variations may be made without departing from the spirit and technical scope of the present disclosure.

Accordingly, the technical scope of the present disclosure is not limited to the contents described in the specification, but defined by the appended claims and their respective equivalents.

What is claimed is:

1. An organic electroluminescence device comprising:
a first electrode;
a second electrode facing the first electrode; and
a plurality of organic layers between the first electrode and the second electrode,
wherein at least one of the plurality of organic layers comprises an organometallic complex comprising a metal atom which is a central atom, a plurality of ligands connected to the metal atom, and a nitrogen atom connecting two of the plurality of ligands;
wherein the nitrogen atom comprises an aromatic ring group as a substituent;
wherein the aromatic ring group is not bonded to any of the plurality of ligands to form a ring;
wherein the organometallic complex is represented by formula 1-3 below:

Formula 1-3

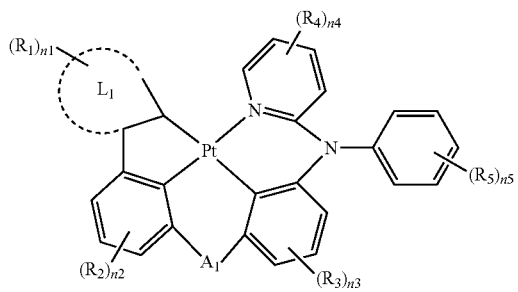

wherein, in formula 1-3 above, $L_1$ is a substituted or unsubstituted 5 membered heterocyclic group or a substituted or unsubstituted ring-forming C2-30 heteroaryl group;
wherein, in formula 1-3 above, $R_1$, $R_2$, $R_3$, and $R_4$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;
wherein, in formula 1-3 above, $R_5$ is a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;
wherein, in formula 1-3 above, $n_1$ to $n_4$ are each independently an integer from 0 to 3;
wherein, in formula 1-3 above, $n_5$ is an integer from 0 to 5;
wherein, in formula 1-3 above, $A_1$ is *—O—*, *—S*, *—S(=O)—*, *—SO$_2$*, *—Se*, *—NR$_{11}$—*, *—R$_{11}$P=O—*, *—CR$_{12}$R$_{13}$, —*, *—C(=O)—*, *—SiR$_{12}$R$_{13}$, —*, *—GeR$_{12}$R$_{13}$, —*, *—BH—*, *—P(O)H—*, *—PH—*, *—NH—*, *—CR$_{12}$H—*, *—CH$_2$*, *—SiH$_2$*, *—SiHR$_{12}$—*, *—BR$_{14}$—*, or *—PR$_{14}$—*; and
wherein, in formula 1-3 above, $R_{11}$, $R_{12}$, $R_{13}$, and $R_{14}$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group.

2. The organic electroluminescence device of claim 1, wherein:
the plurality of organic layers comprise a hole transport region, a light emitting layer, and an electron transport region; and
the organometallic complex is included in the light emitting layer.

3. The organic electroluminescence device of claim 1, wherein the organometallic complex is one of the compounds represented below:

1

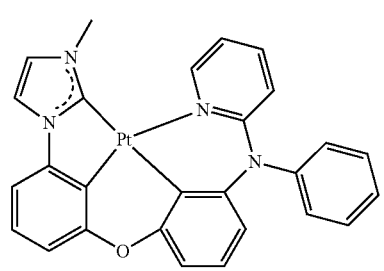

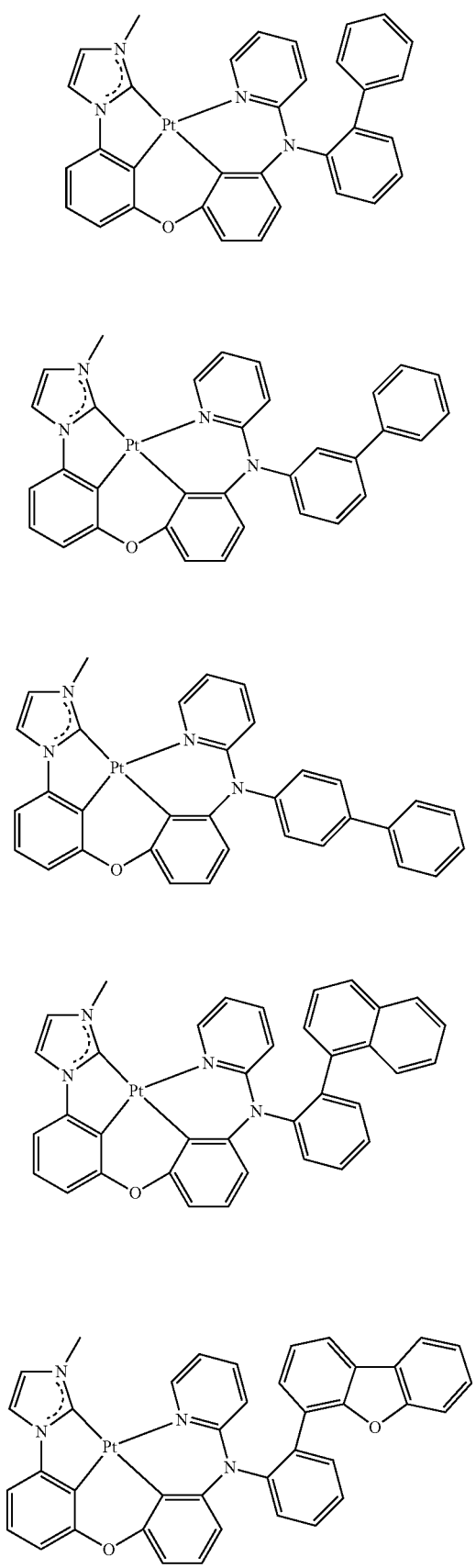
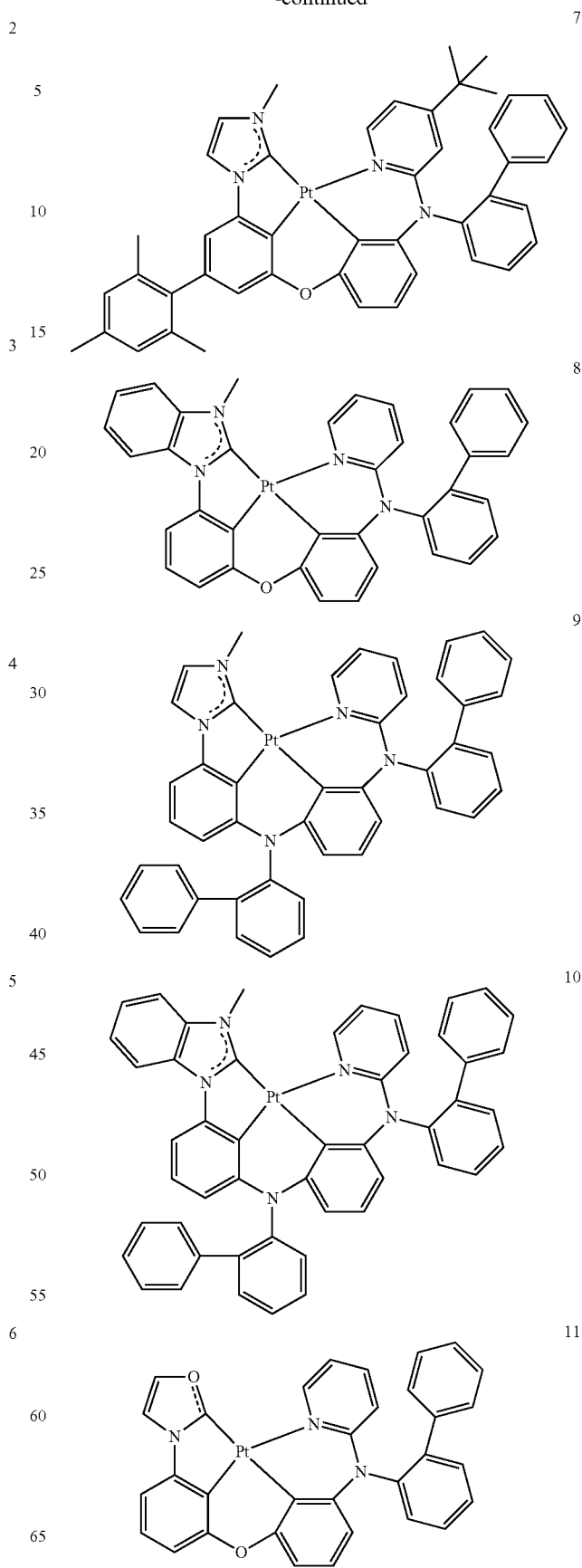

-continued

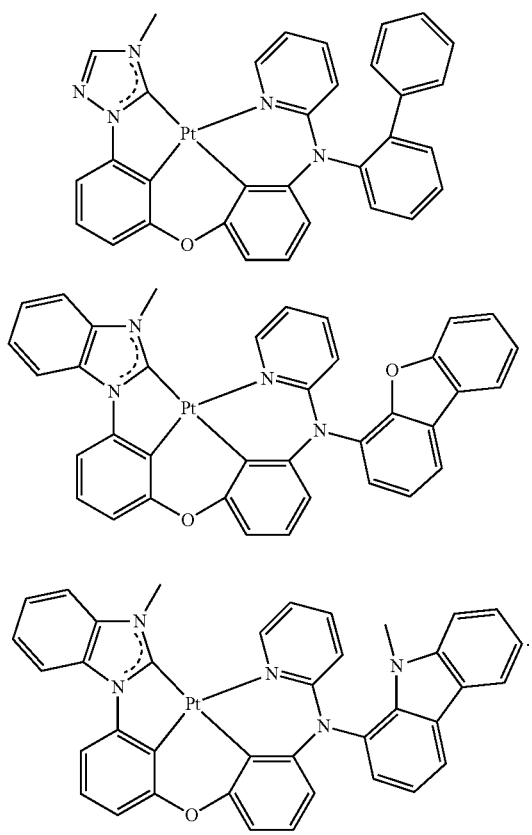

4. An organic electroluminescence device comprising:
a first electrode;
a second electrode facing the first electrode; and
a plurality of organic layers between the first electrode and the second electrode wherein at least one of the plurality of organic layers comprises an organometallic complex represented by formula 1-3 below:

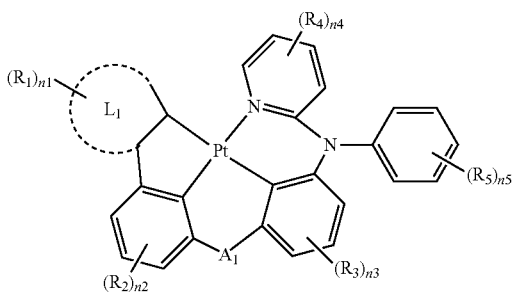

Formula 1-3 wherein, in formula 1-3 above, $L_1$ is a substituted or unsubstituted 5 membered heterocyclic group or a substituted or unsubstituted ring-forming C2-30 heteroaryl group;
wherein, in formula 1-3 above, $R_1$, $R_2$, $R_3$, and $R_4$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;
wherein, in formula 1-3 above, $R_5$ is a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;
wherein, in formula 1-3 above, $n_1$ to $n_4$ are each independently an integer from 0 to 3;
wherein, in formula 1-3 above, $n_5$ is an integer from 0 to 5;
wherein, in formula 1-3 above, $A_1$ is *—O—*, *—S—*, *S(=O)—*, *-SO2-*, *—Se—*, *—NR$_{11}$—*, *—R$_{11}$P=O—*, *—CR$_{12}$R$_{13}$—*, *—C(=O)—*, *—SiR$_{12}$R$_{13}$*, *—GeR$_{12}$R$_{13}$*, *—BH—*, *—P(O)H—* *—PH—*, *—NH—*, *—CR$_{12}$H—*, *—CH$_2$*, *—SiH$_2$*, *—SiHR$_{12}$—*, *—BR$_{14}$—*, or *—PR$_{14}$—*; and
wherein, in formula 1-3 above, $R_{11}$, $R_{12}$, $R_{13}$, and $R_{14}$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group.

5. The organic electroluminescence device of claim 4, wherein the organometallic complex is one of the compounds below:

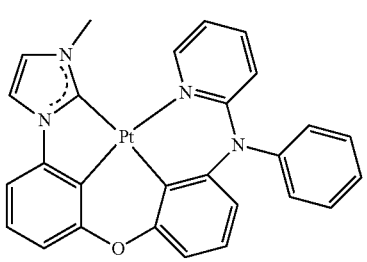

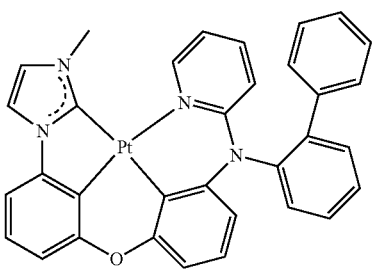

3
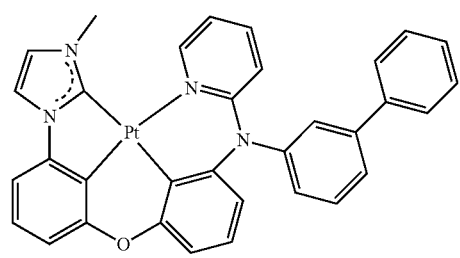
4
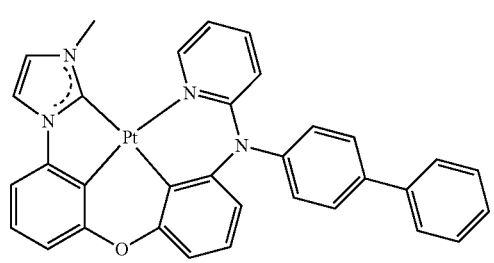
5
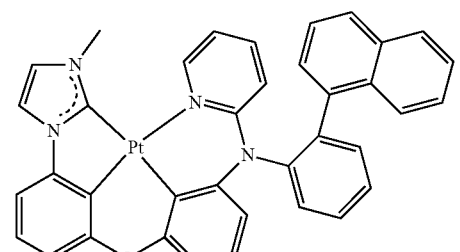
6
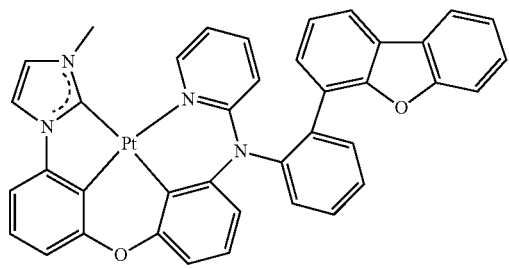
7
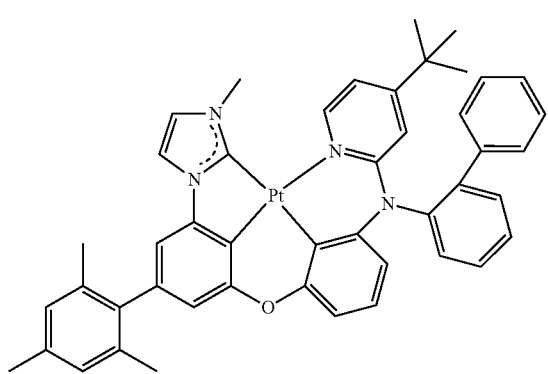
8
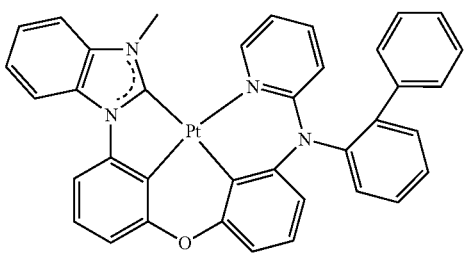
9
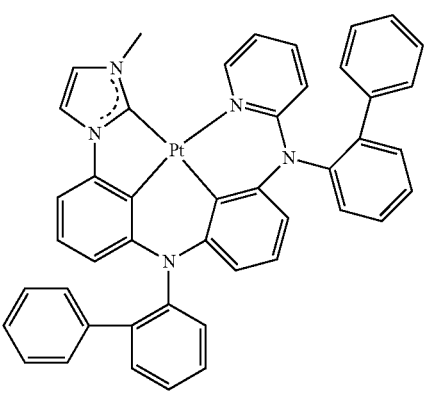
10
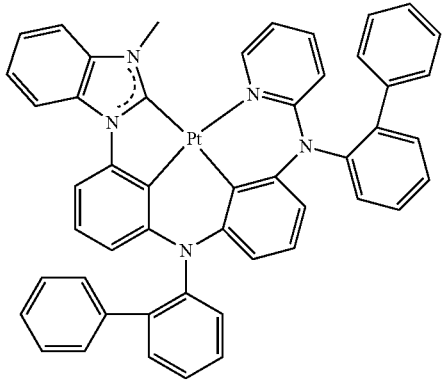
11
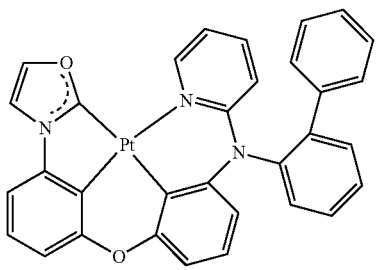
12
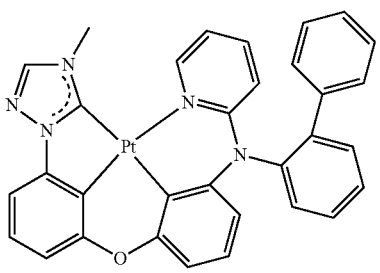

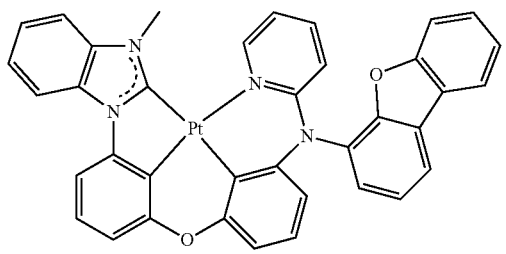

13

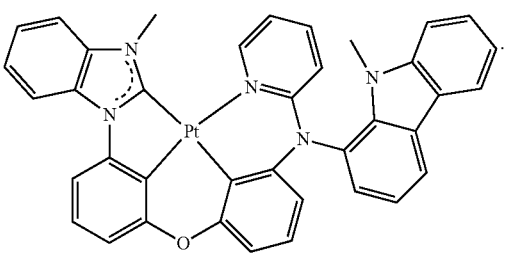

14

6. An organometallic complex represented by formula 1-3 below:

Formula 1-3

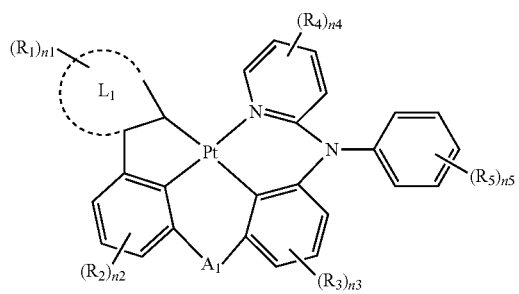

wherein, in formula 1-3 above, $L_1$ is a substituted or unsubstituted 5 membered heterocyclic group or a substituted or unsubstituted ring-forming C2-30 heteroaryl group, wherein, in formula 1-3 above, $R_1$, $R_2$, $R_3$, and $R_4$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;

wherein, in formula 1-3 above, $R_5$ is a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group;

wherein, in formula 1-3 above, $n_1$ to $n_4$ are each independently an integer from 0 to 3;

wherein, in formula 1-3 above, $n_5$ is an integer from 0 to 5;

wherein, in formula 1-3 above, $A_1$ is *—O*, *—S—*, *S(=O)—*, *—SO_2—*, *—Se—*, *—NR_{11}—*, *—R_{11}P=O—*, *—CR_{12}R_{13}, —*, *—C(=O)—*, *—SiR_{12}R_{13}, —*, *—GeR_{12}R_{13}, —*, *—BH—*, *—P(O)H—*, *—PH—*, *—NH—*, *—CR_{12}H—*, *—CH_2*, *—SiH_2*, *—SiHR_{12}—*, *—BR_{14}—*, or *—PR_{14}—*; and wherein, in formula 1-3 above, $R_{11}$, $R_{12}$, $R_{13}$, and $R_{14}$ are each independently a hydrogen atom, a deuterium atom, a halogen atom, a substituted or unsubstituted ring-forming C6-30 aryl group, a substituted or unsubstituted ring-forming C6-30 heteroaryl group, a substituted or unsubstituted C1-30 alkyl group, a substituted or unsubstituted C2-30 alkenyl group, a substituted or unsubstituted C2-30 alkynyl group, a substituted or unsubstituted amino group, a carbonyl group, a hydroxy group, a thiol group, a nitrile group, a cyano group, an alkoxy group, an ester group, a sulfonic acid group, a carboxyl group, or a silyl group.

7. The organometallic complex of claim 6, wherein the organometallic complex is one of the compounds below:

1

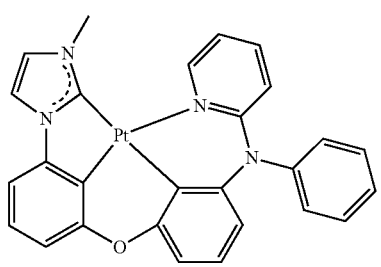

2

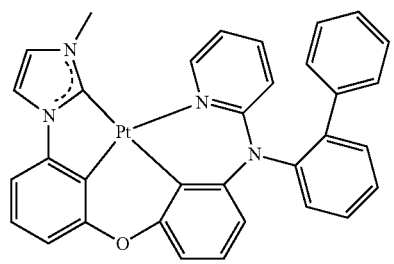

3

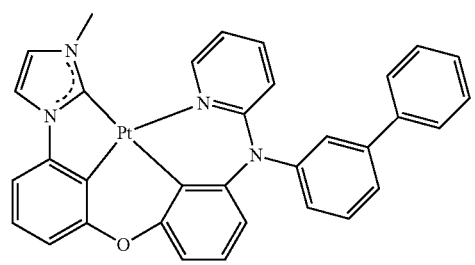

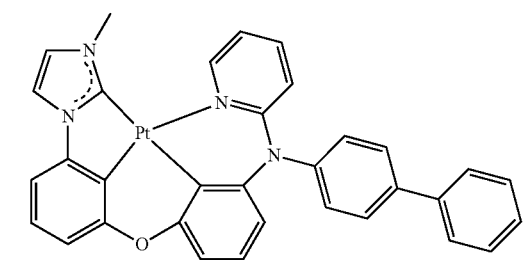
4
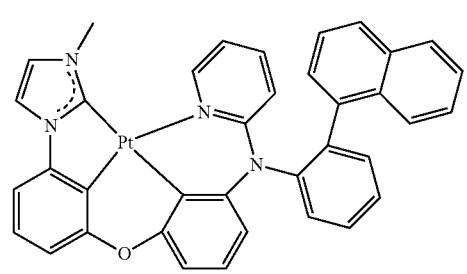
5
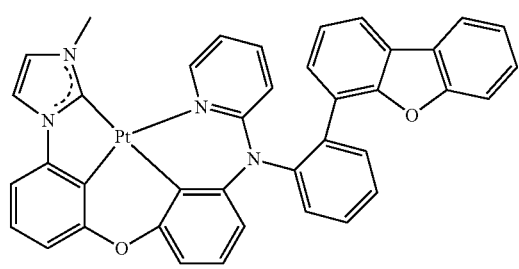
6
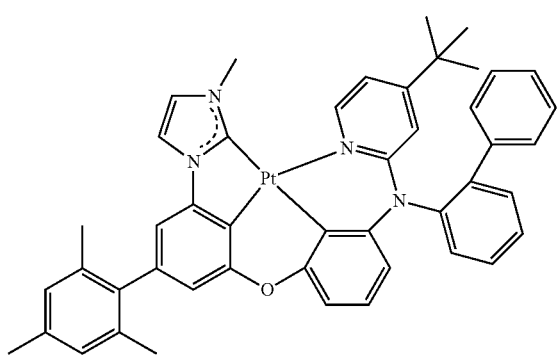
7
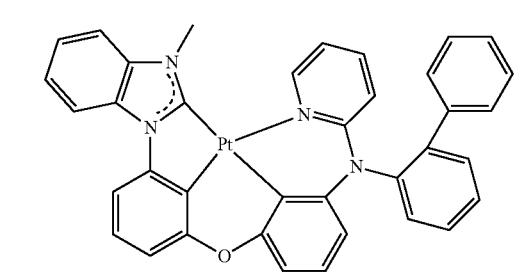
8
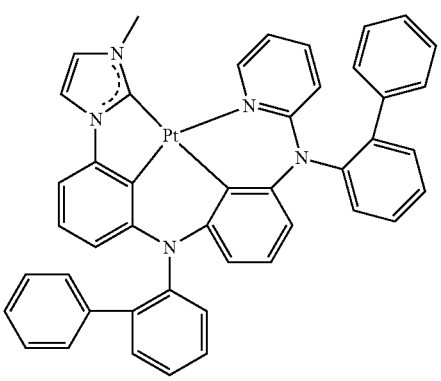
9
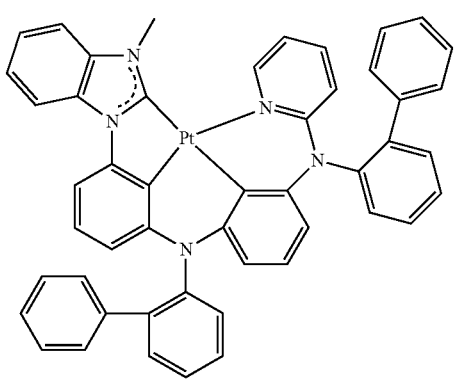
10
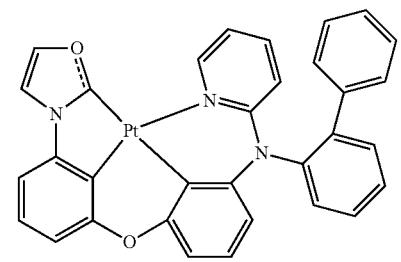
11
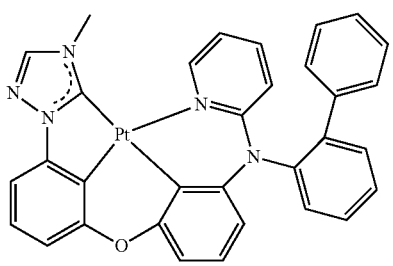
12
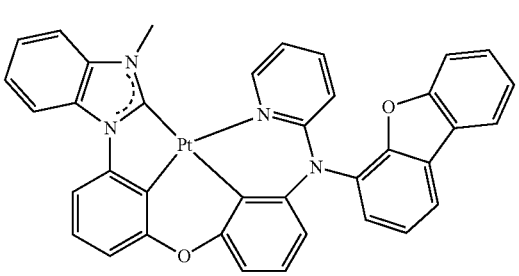
13

-continued
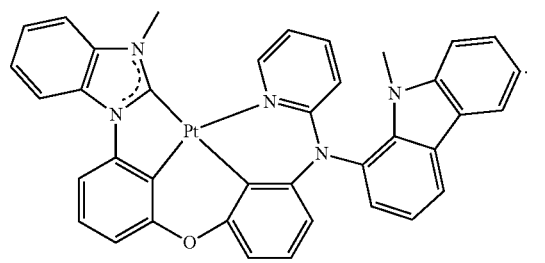
* * * * *

UNITED STATES PATENT AND TRADEMARK OFFICE
CERTIFICATE OF CORRECTION

PATENT NO.        : 12,035,616 B2
APPLICATION NO.   : 16/890520
DATED             : July 9, 2024
INVENTOR(S)       : Haejin Kim et al.

It is certified that error appears in the above-identified patent and that said Letters Patent is hereby corrected as shown below:

In the Claims

In Column 30, Line 24, in Claim 1, delete "*—S*," and insert -- *—S—*, --.
In Column 30, Line 25, in Claim 1, delete "*—SO$_2$*," and insert -- *—SO$_2$—*, --.
In Column 30, Line 25, in Claim 1, delete "*—Se*," and insert -- *—Se—*, --.
In Column 30, Line 26, in Claim 1, delete "*—CR$_{12}$R$_{13}$,—*," and insert -- *—CR$_{12}$R$_{13}$—*, --.
In Column 30, Line 27, in Claim 1, delete "*—SiR$_{12}$R$_{13}$,—*," and insert -- *—SiR$_{12}$R$_{13}$—*, --.
In Column 30, Line 27, in Claim 1, delete "*—GeR$_{12}$R$_{13}$,—*," and insert -- *—GeR$_{12}$R$_{13}$—*, --.
In Column 30, Line 29, in Claim 1, delete "*—CH$_2$*," and insert -- *—CH$_2$—*, --.
In Column 30, Line 29, in Claim 1, delete "*—SiH$_2$*," and insert -- *—SiH$_2$—*, --.
In Column 33, Line 40, in Claim 4, delete "electrode" and insert -- electrode; --.
In Column 34, Line 24, in Claim 4, delete "*S(=O)—*," and insert -- *—S(=O)—*, --.
In Column 34, Line 24, in Claim 4, delete "*-SO2-*," and insert -- *—SO$_2$—*, --.
In Column 34, Line 25, in Claim 4, delete "*—CR$_{12}$R$_{13}$,—*," and insert -- *—CR$_{12}$R$_{13}$—*, --.
In Column 34, Line 26, in Claim 4, delete "*—SiR$_{12}$R$_{13}$*," and insert -- *—SiR$_{12}$R$_{13}$—*, --.
In Column 34, Line 26, in Claim 4, delete "*—GeR$_{12}$R$_{13}$*," and insert -- *—GeR$_{12}$R$_{13}$—*, --.
In Column 34, Line 27, in Claim 4, after "*—P(O)H—*" insert -- , --.
In Column 34, Line 28, in Claim 4, delete "*—CH$_2$*," and insert -- *—CH$_2$—*, --.
In Column 34, Line 28, in Claim 4, delete "*—SiH$_2$*," and insert -- *—SiH$_2$—*, --.
In Column 37, Line 44, in Claim 6, delete "group," and insert -- group; --.
In Column 38, Line 6, in Claim 6, delete "*—O*," and insert -- *—O—*, --.
In Column 38, Line 7, in Claim 6, delete "*S(=O)—*," and insert -- *—S(=O)—*, --.
In Column 38, Line 8, in Claim 6, delete "*—CR$_{12}$R$_{13}$,—*," and insert -- *—CR$_{12}$R$_{13}$—*, --.
In Column 38, Line 9, in Claim 6, delete "*—SiR$_{12}$R$_{13}$,—*," and insert -- *—SiR$_{12}$R$_{13}$—*, --.
In Column 38, Line 9, in Claim 6, delete "*—GeR$_{12}$R$_{13}$,—*," and insert -- *—GeR$_{12}$R$_{13}$—*, --.
In Column 38, Line 11, in Claim 6, delete "*—CH$_2$"," and insert -- *—CH$_2$—*, --.
In Column 38, Line 11, in Claim 6, delete "*—SiH$_2$*," and insert -- *—SiH$_2$—*, --.

Signed and Sealed this
Third Day of December, 2024

Katherine Kelly Vidal
*Director of the United States Patent and Trademark Office*